(12) United States Patent
Skinner et al.

(10) Patent No.: US 12,127,378 B2
(45) Date of Patent: *Oct. 22, 2024

(54) HEATSINK CLAMP FOR MULTIPLE ELECTRONIC COMPONENTS

(71) Applicant: Nidec Motor Corporation, St. Louis, MO (US)

(72) Inventors: James L. Skinner, Collinsville, IL (US); Richard A. Belley, Hillsboro, MO (US); Michael L. Largent, O'Fallon, IL (US)

(73) Assignee: Nidec Motor Corporation, St. Louis, MO (US)

( * ) Notice: Subject to any disclaimer, the term of this patent is extended or adjusted under 35 U.S.C. 154(b) by 339 days.

This patent is subject to a terminal disclaimer.

(21) Appl. No.: 17/492,332

(22) Filed: Oct. 1, 2021

(65) Prior Publication Data
US 2022/0021273 A1 Jan. 20, 2022

Related U.S. Application Data

(63) Continuation of application No. 16/459,265, filed on Jul. 1, 2019, now Pat. No. 11,146,144.

(51) Int. Cl.
*H05K 7/20* (2006.01)
*F04D 29/70* (2006.01)
(Continued)

(52) U.S. Cl.
CPC ....... *H05K 7/20509* (2013.01); *F04D 29/703* (2013.01); *H02K 9/227* (2021.01);
(Continued)

(58) Field of Classification Search
CPC .... F04D 29/703; H05K 7/20; H05K 7/20918; H05K 2201/10393; H05K 2201/10598;
(Continued)

(56) References Cited

U.S. PATENT DOCUMENTS 5,134,545 A * 7/1992 Smith ................ H01L 23/4006
361/720
5,450,284 A * 9/1995 Wekell ............... H01L 23/4006
257/725

(Continued)

*Primary Examiner* — Jacob R Crum
*Assistant Examiner* — Matthew Sinclair Muir
(74) *Attorney, Agent, or Firm* — Hovey Williams LLP

(57) ABSTRACT

An electric motor assembly includes a stator, a rotor, a motor housing, a rotatable shaft, a radial fan, and an air scoop. The motor housing at least partly houses the stator and rotor and presents an exterior motor surface. The rotatable shaft is associated with the rotor for rotational movement therewith, with the rotatable shaft extending along a rotational axis. The radial fan is mounted on the rotatable shaft exteriorly of the motor housing and is rotatable with the shaft to direct airflow in a radially outward direction. The air scoop extends radially outwardly relative to the radial fan and axially to receive radial airflow from the radial fan and turn the airflow axially to flow along the exterior motor surface. The air scoop includes spaced apart axially extending airflow vanes to guide the airflow as the airflow is turned axially.

20 Claims, 36 Drawing Sheets

(51) Int. Cl.
  *H02K 9/22* (2006.01)
  *H02K 11/33* (2016.01)
  *H02K 21/16* (2006.01)
  *H01F 27/08* (2006.01)
  *H02K 9/06* (2006.01)

(52) U.S. Cl.
  CPC ............ *H02K 11/33* (2016.01); *H02K 21/16* (2013.01); *H05K 7/20* (2013.01); *H05K 7/20918* (2013.01); *H01F 27/08* (2013.01); *H02K 9/06* (2013.01); *H02K 2211/03* (2013.01); *H05K 2201/10393* (2013.01); *H05K 2201/10598* (2013.01)

(58) Field of Classification Search
  CPC . H05K 7/20509; H01F 27/08; H01L 23/4006; H01L 2023/405; H01L 2023/4025; H02K 9/227; H02K 11/33; H02K 21/16; H02K 9/06; H02K 2211/03; H02K 1/148; H02K 5/10; H02K 1/278; H02K 5/1732; H02K 5/15; H02K 7/083; F04B 53/08; H02P 29/68
  See application file for complete search history.

(56) References Cited

U.S. PATENT DOCUMENTS

| | | | | |
|---|---|---|---|---|
| 6,049,459 | A | * | 4/2000 | Edmonds ............ H01L 23/4006 174/16.3 |
| 6,088,226 | A | * | 7/2000 | Rearick ............... H01L 23/4006 361/717 |
| 2018/0376613 | A1 | * | 12/2018 | Chida ..................... F16B 2/065 |
| 2019/0379258 | A1 | * | 12/2019 | Hon ....................... H05K 7/209 |

* cited by examiner

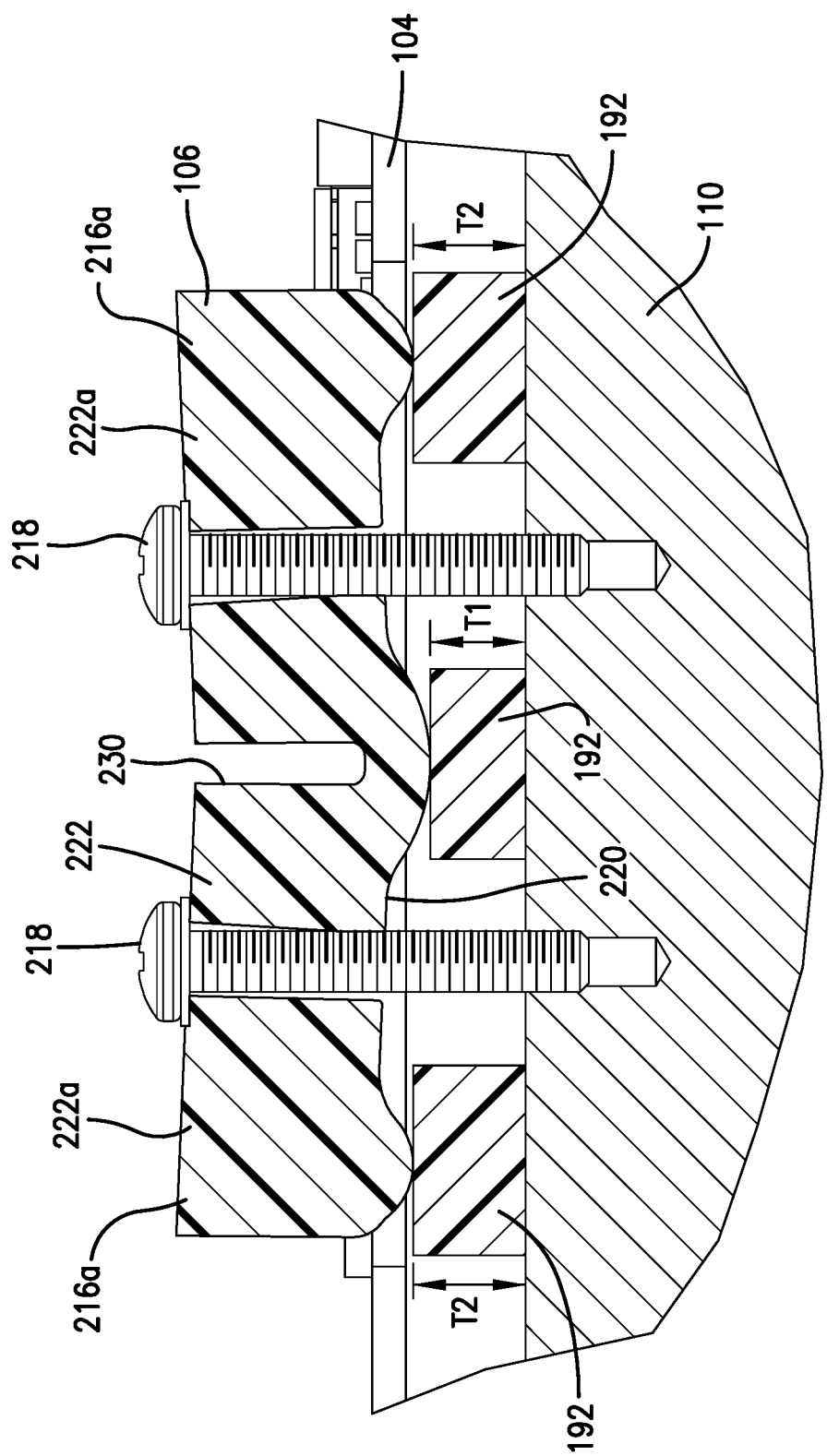

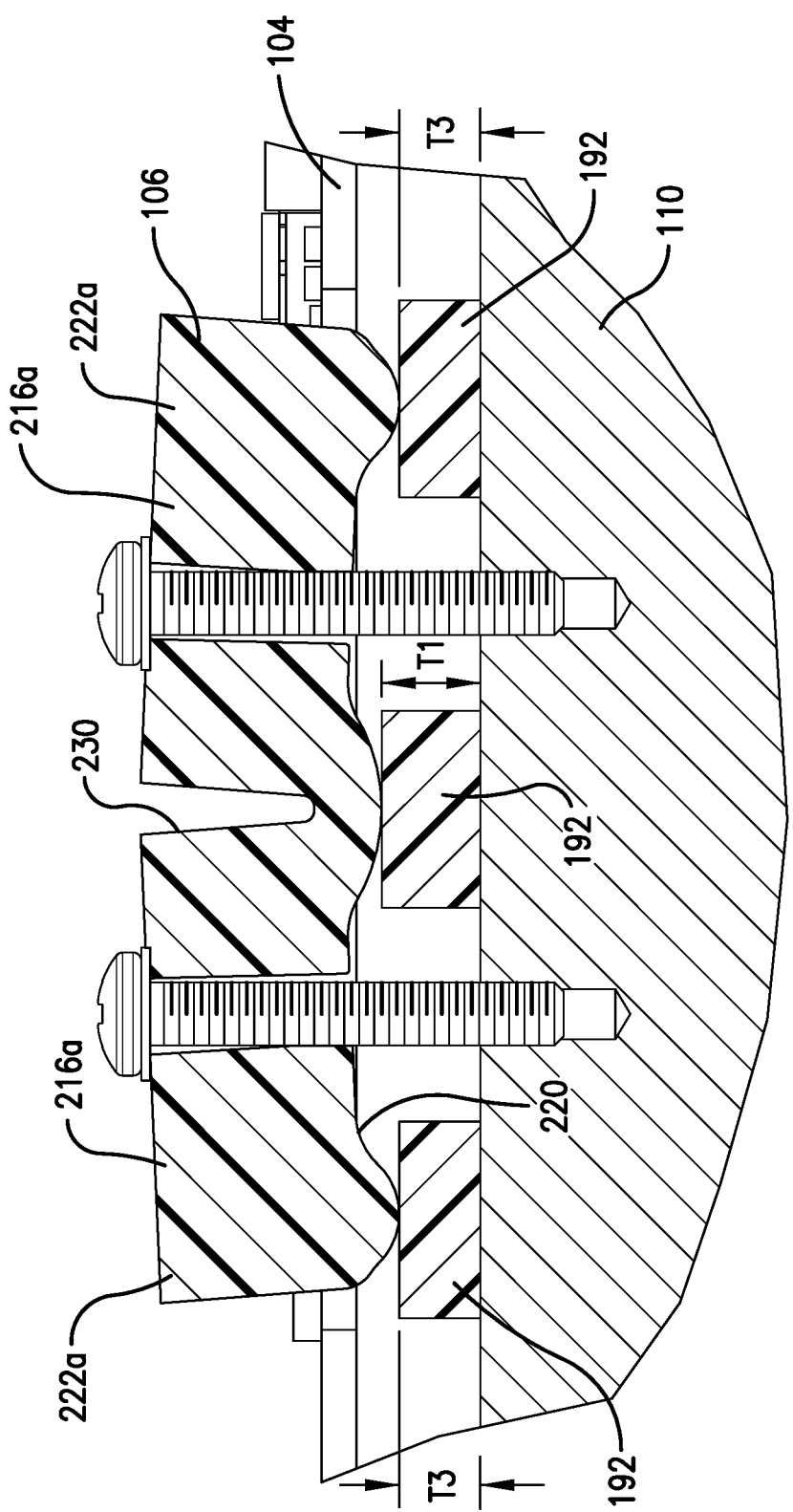

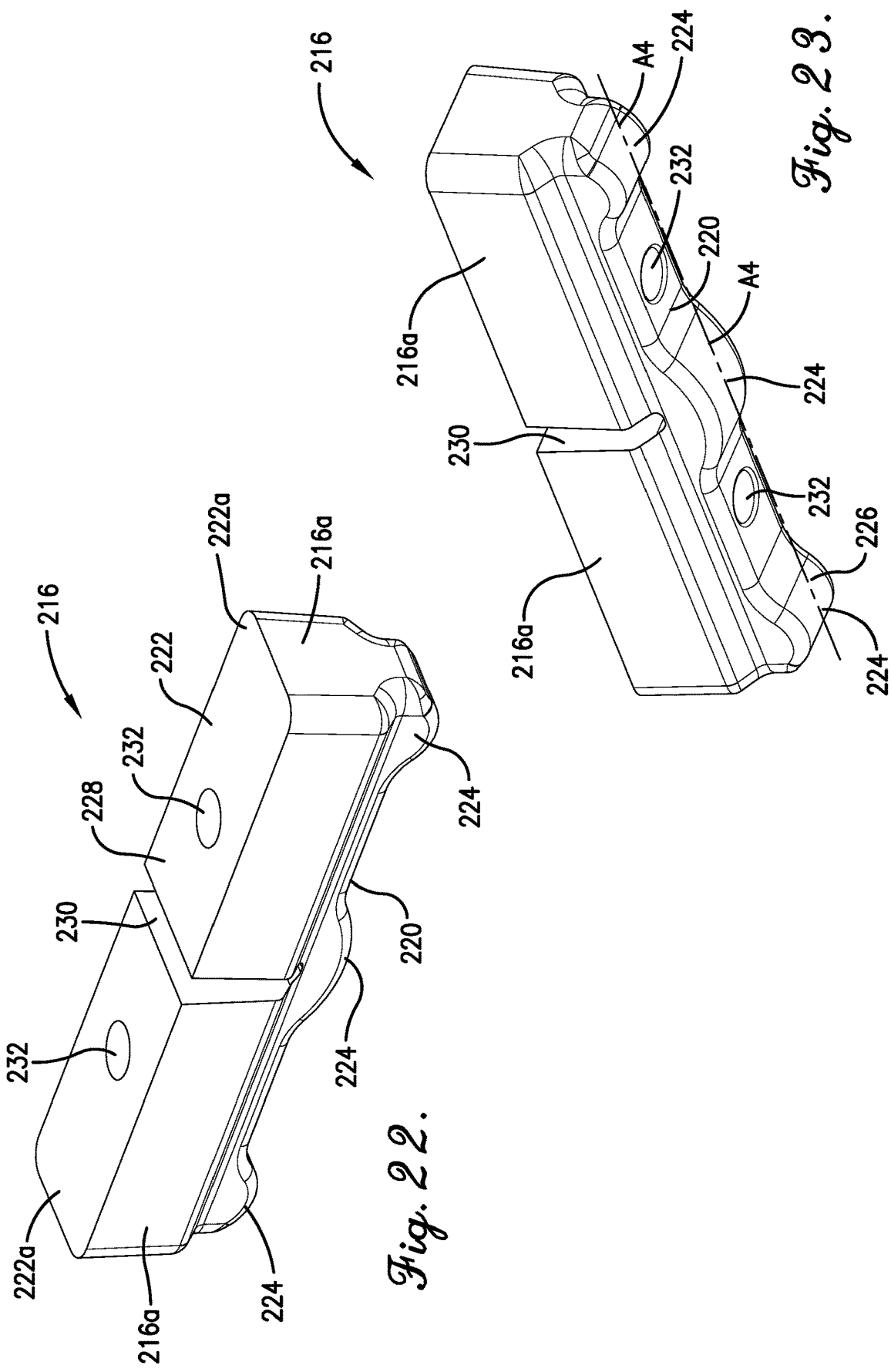

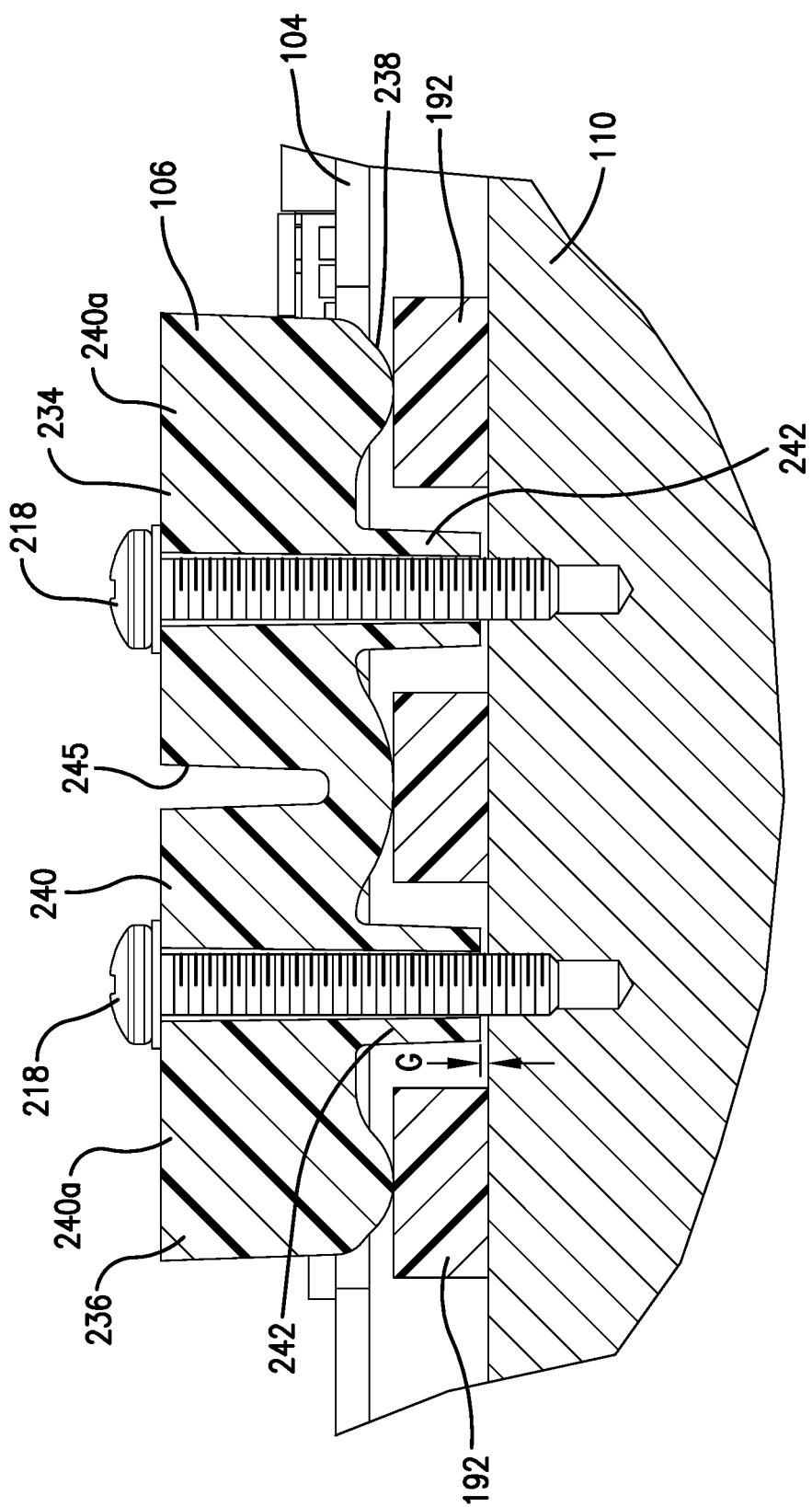

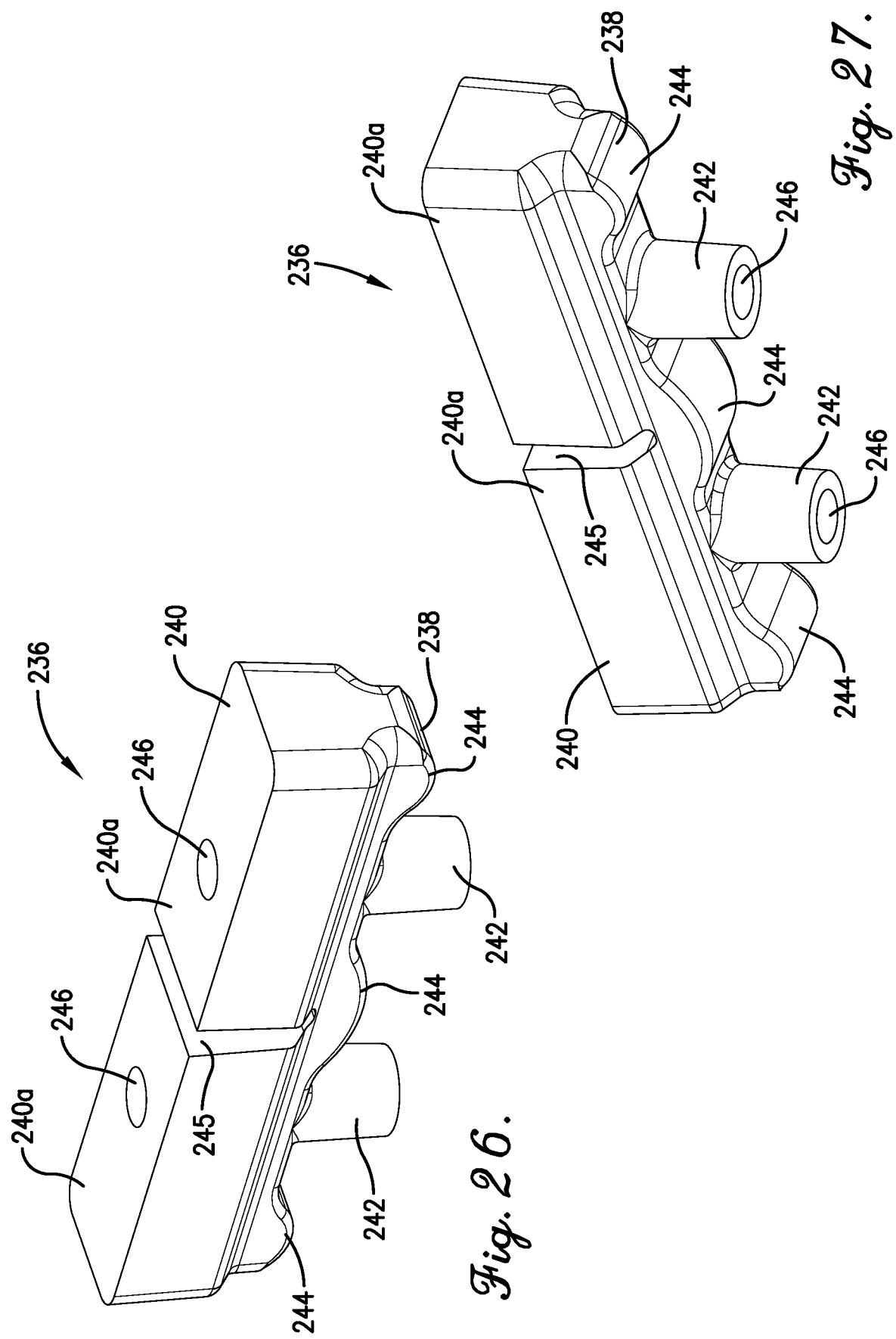

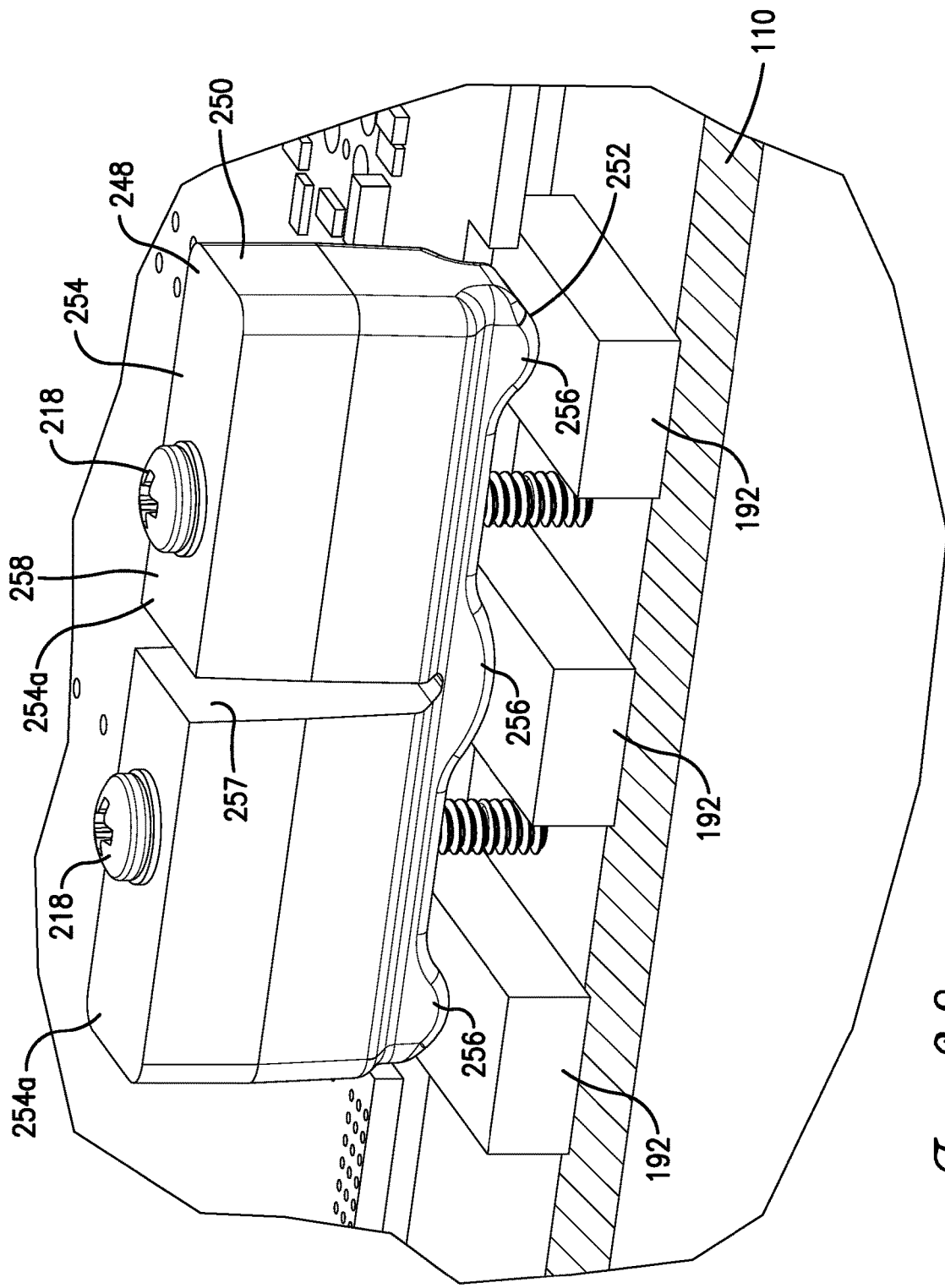

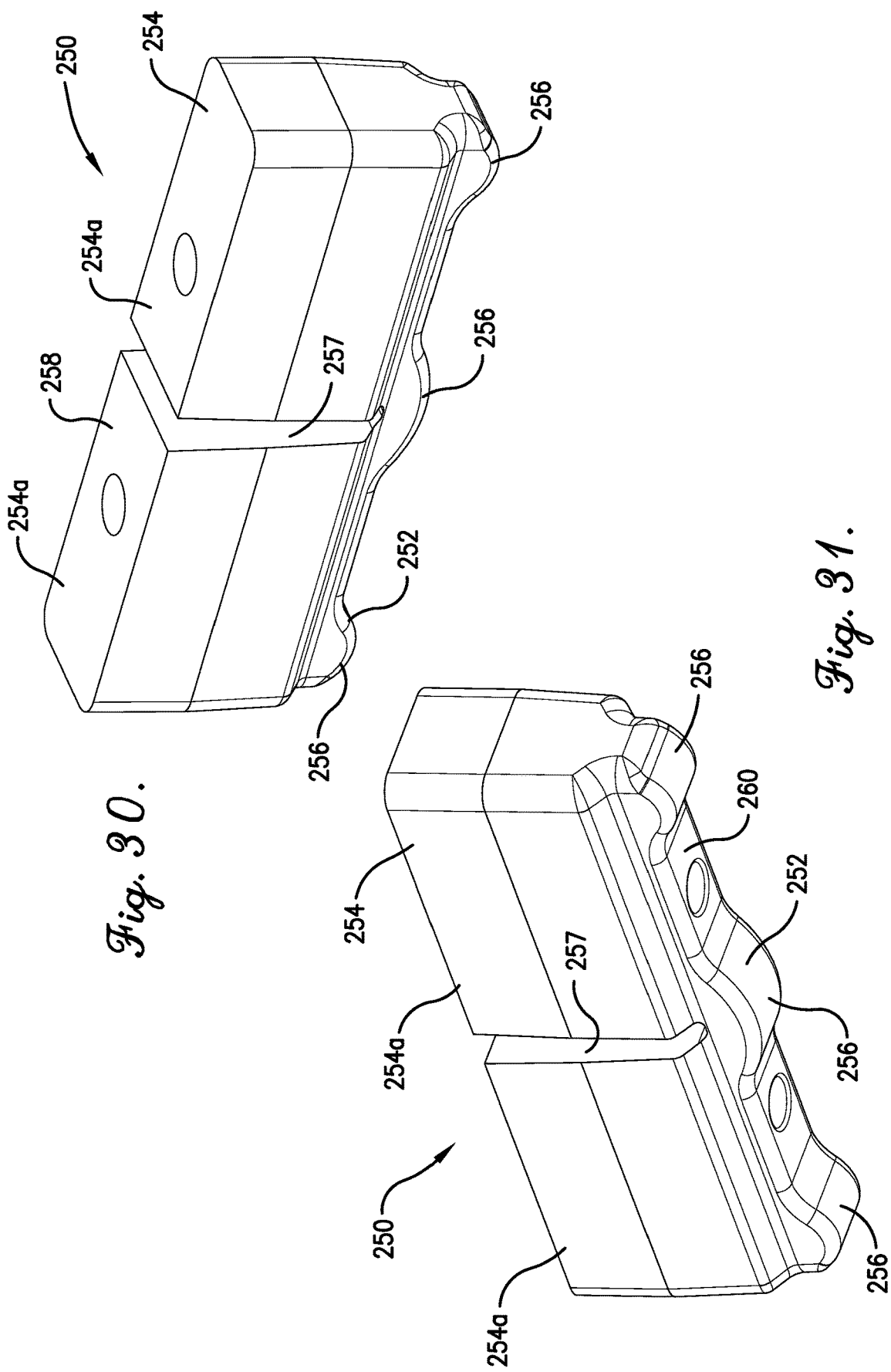

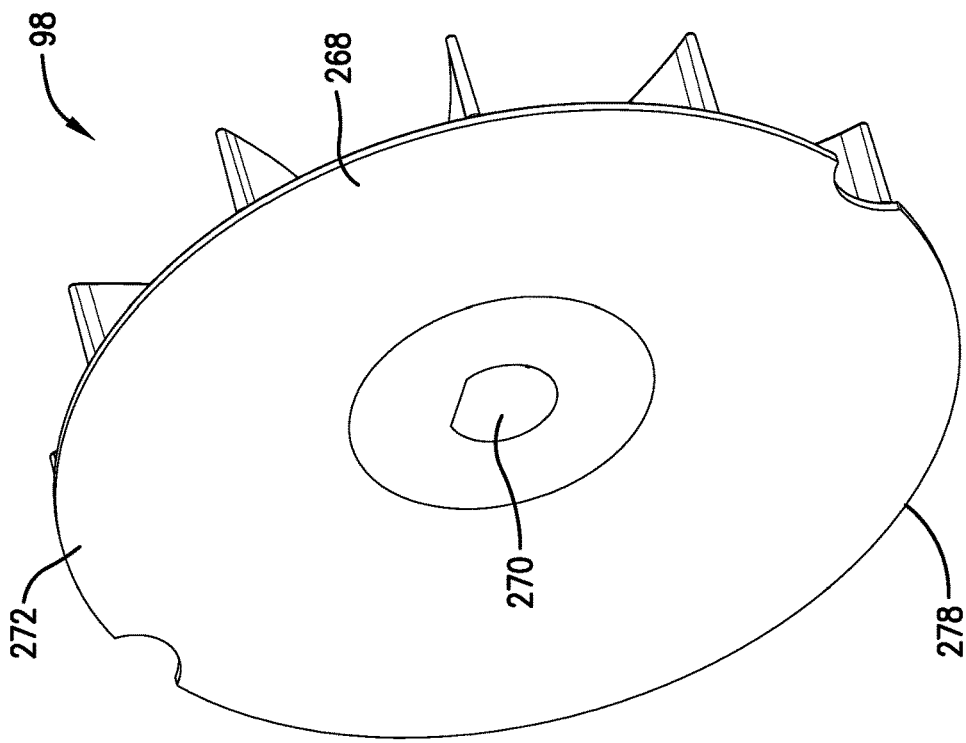
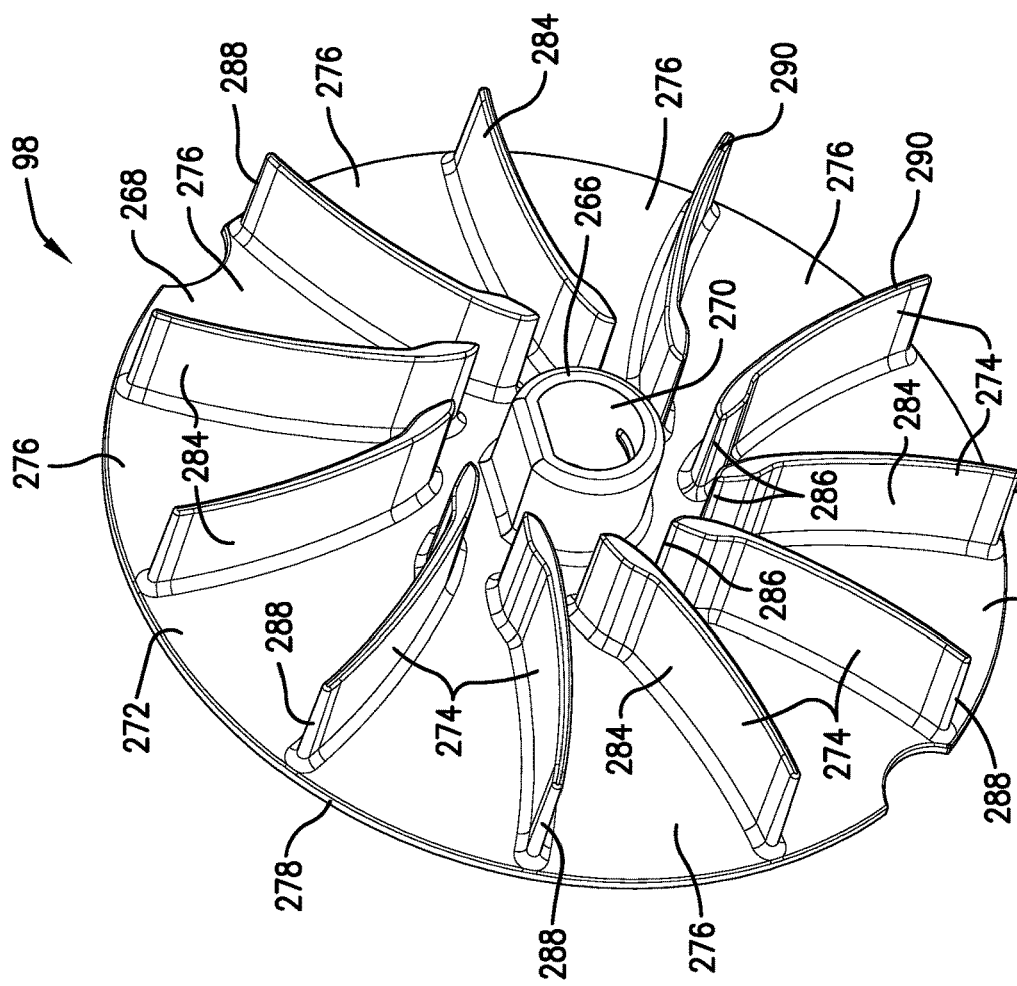

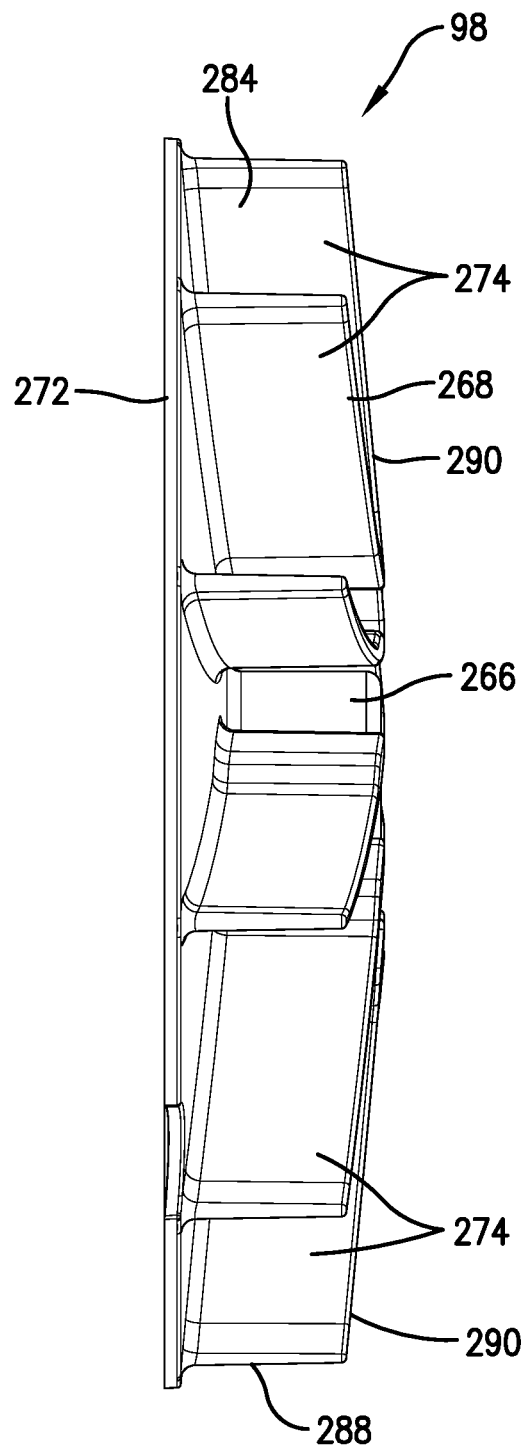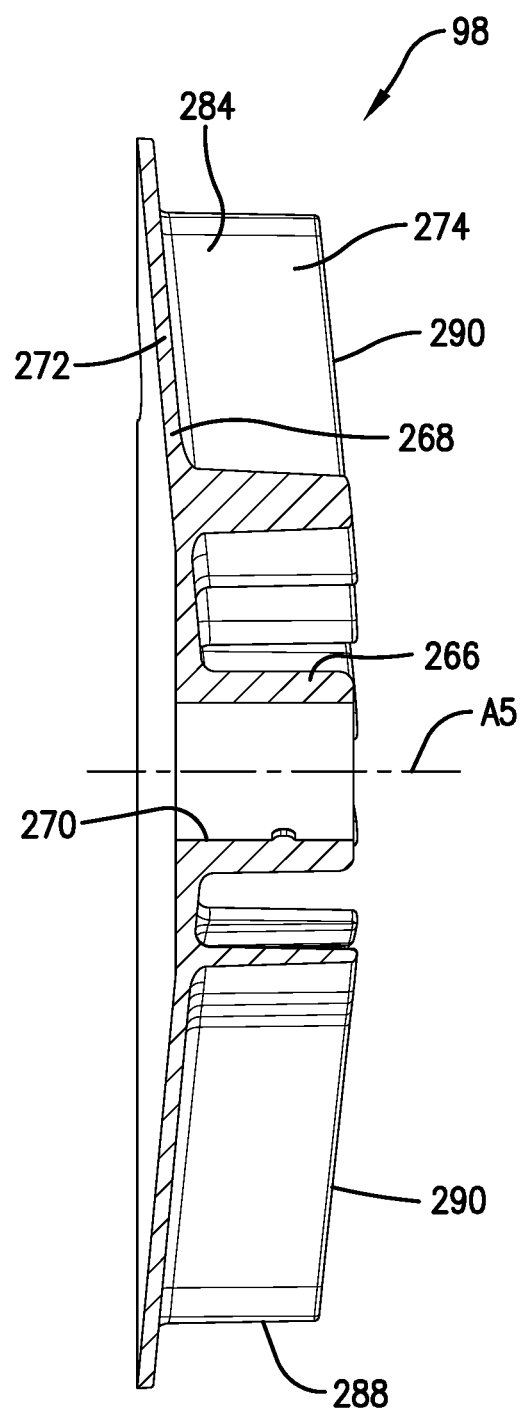
Fig. 41.
Fig. 42.

HEATSINK CLAMP FOR MULTIPLE ELECTRONIC COMPONENTS

CROSS-REFERENCE TO RELATED APPLICATIONS

This is a continuation of prior application Ser. No. 16/459,265, filed Jul. 1, 2019, entitled MOTOR FAN AND GUARD FOR DIRECTING COOLANT AIR, which is hereby incorporated in its entirety by reference herein.

application Ser. No. 16/459,265 was filed contemporaneously with U.S. Nonprovisional application Ser. No. 16/459,244, entitled HEATSINK CLAMP FOR MULTIPLE ELECTRONIC COMPONENTS, U.S. Nonprovisional application Ser. No. 16/459,204, entitled MOTOR CONTROLLER WITH INDUCTOR MOUNTED TRANSVERSE TO CONTROL BOARD, U.S. Design application No. 29/696,824, entitled MOTOR CONTROLLER HOUSING, and U.S. Design application No. 29/696,823, entitled MOTOR AIR SCOOP, each of which is hereby incorporated in its entirety by reference herein.

BACKGROUND

1. Field

The present invention relates generally to electric motors. More specifically, embodiments of the present invention concern an electric motor assembly including a radial fan and air scoop.

2. Discussion of Prior Art

It is common in the prior art for an electric motor assembly to include a motor housing and a motor controller mounted exteriorly to the housing. It is well known that motor controllers develop substantial amounts of heat during motor operation. For this reason, conventional motor controllers include a heat sink with exterior fins to dissipate heat generated within the controller and discharge the heat to ambient. Heat sinks are generally operable to discharge heat from an enclosed container, although this capability can be limited in certain applications. For instance, exterior motor controllers often position the heat sink so that the fins are located adjacent the motor housing, such that heat transfer from the exterior fins is unduly limited (e.g., such a configuration may cause air adjacent the fins to be stagnant).

In some conventional embodiments, the electric motor includes a rotating cooling fan that provides cooling air for removing heat from an external motor controller. In particular, the cooling fan provides a forced flow of cooling air that is directed along the heat sink associated with the motor controller. Those of skill in the art will appreciate that the flow of cooling air across the heat sink generally enhances heat transfer from the heat sink to ambient.

However, prior art electric motors with external motor controllers are problematic, and the associated cooling devices have several deficiencies. Even where the motor controller is used in combination with a cooling fan to force air over the heat sink, such prior art configurations are inefficient or fail to provide adequate heat transfer from the motor controller. For instance, known cooling fan arrangements produce a cooling stream of air that is turbulent and not uniform as it reaches the heat sink.

This background discussion is intended to provide information related to the present invention which is not necessarily prior art.

SUMMARY

The following brief summary is provided to indicate the nature of the subject matter disclosed herein. While certain aspects of the present invention are described below, the summary is not intended to limit the scope of the present invention.

Embodiments of the present invention provide a fan and air scoop that do not suffer from the problems and limitations of the prior art devices, including those set forth above.

A first aspect of the present invention concerns an electric motor assembly that broadly includes a stator, a rotor, a motor housing, a rotatable shaft, a radial fan, and an air scoop. The rotor is rotatable relative to the stator. The motor housing at least partly houses the stator and rotor and presents an exterior motor surface. The rotatable shaft is associated with the rotor for rotational movement therewith, with the rotatable shaft extending along a rotational axis. The radial fan is mounted on the rotatable shaft exteriorly of the motor housing and is rotatable with the shaft to direct airflow in a radially outward direction. The air scoop extends radially outwardly relative to the radial fan and axially to receive radial airflow from the radial fan and turn the airflow axially to flow along the exterior motor surface. The air scoop includes spaced apart axially extending airflow vanes to guide the airflow as the airflow is turned axially.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Preferred embodiments of the invention are described in detail below with reference to the attached drawing figures, wherein.

Figure 1:
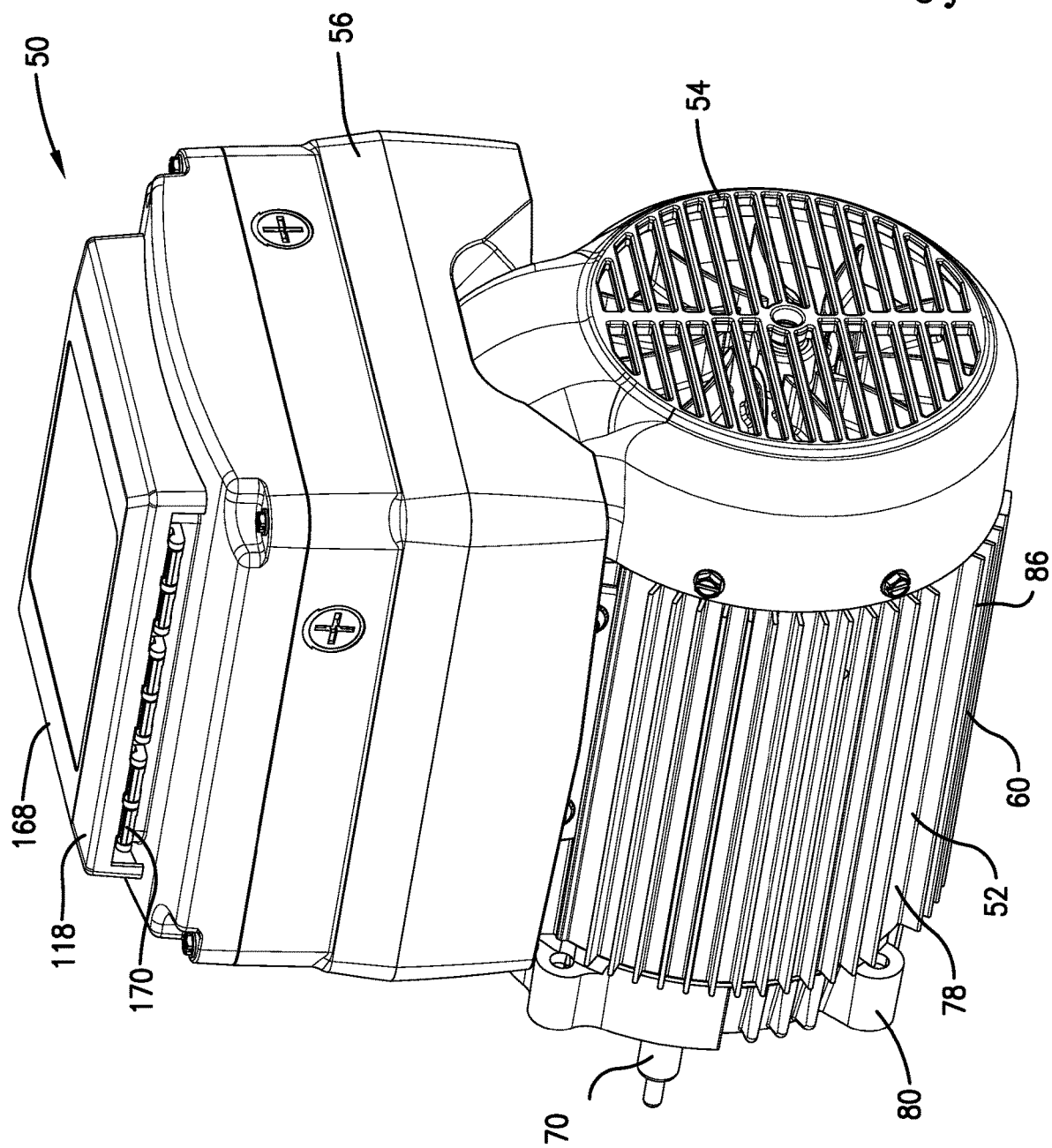
FIG. 1 is a perspective of an electric motor assembly constructed in accordance with a preferred embodiment of the present invention, showing an electric motor, a motor fan assembly mounted on the electric motor, and a motor control assembly operably coupled to the electric motor.
Figure 3:
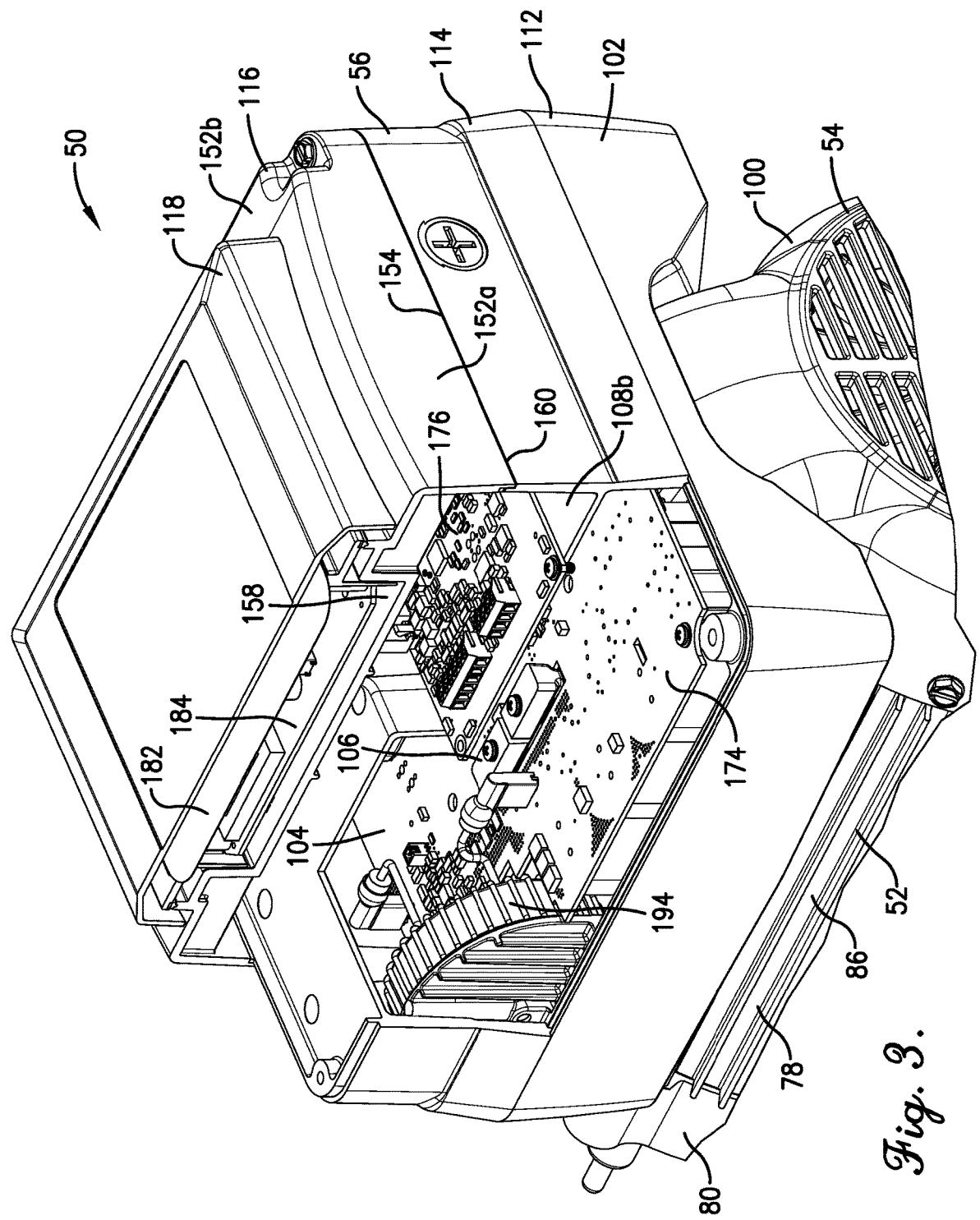
FIG. 3 is a fragmentary perspective of the electric motor assembly shown in FIG. 1, particularly depicting the control housing and motor controller of the motor control assembly, with the control housing being cross-sectioned to depict a lower housing section, middle housing section, upper housing section, and user interface housing of the control housing.
Figure 4:
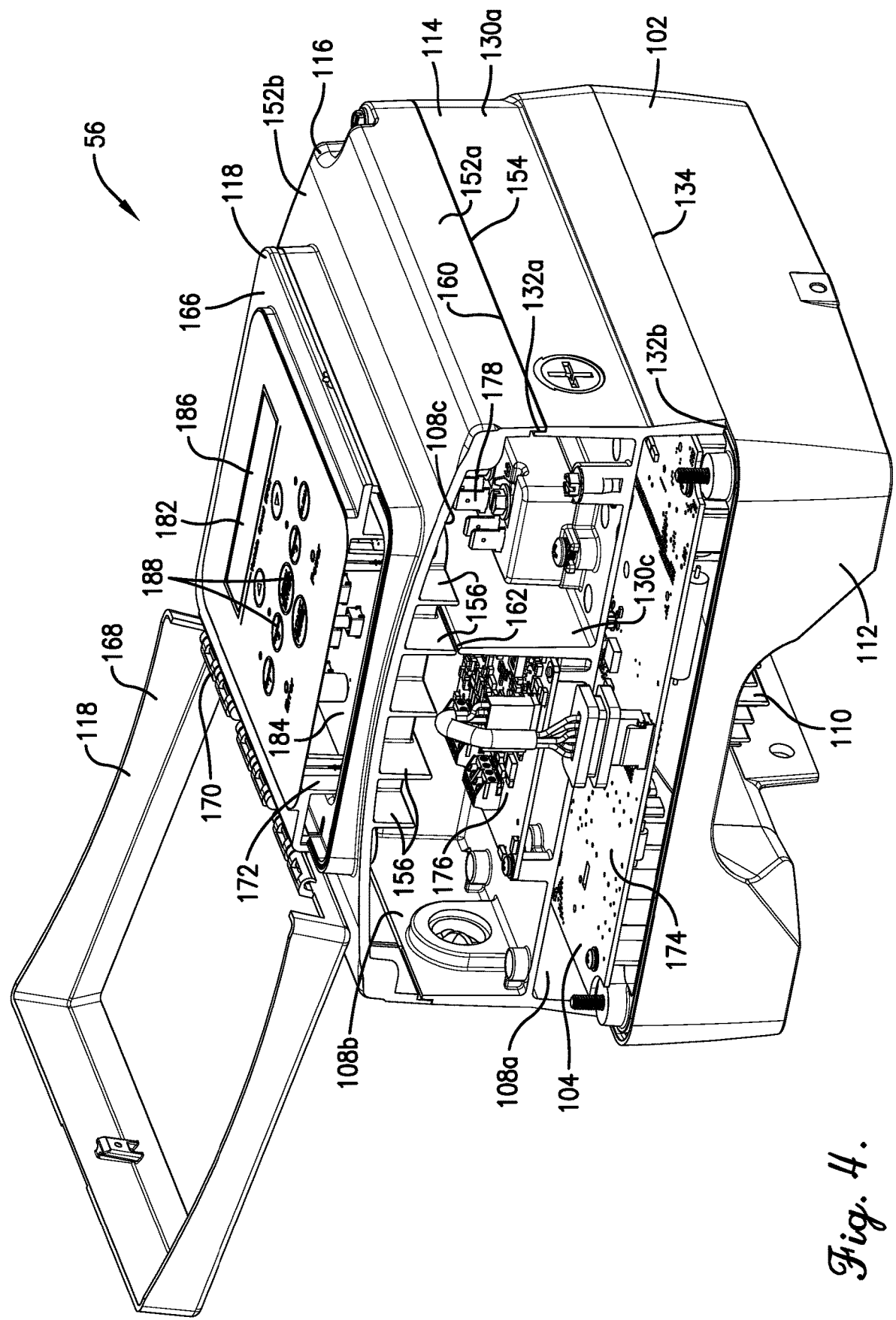
Figure 5:
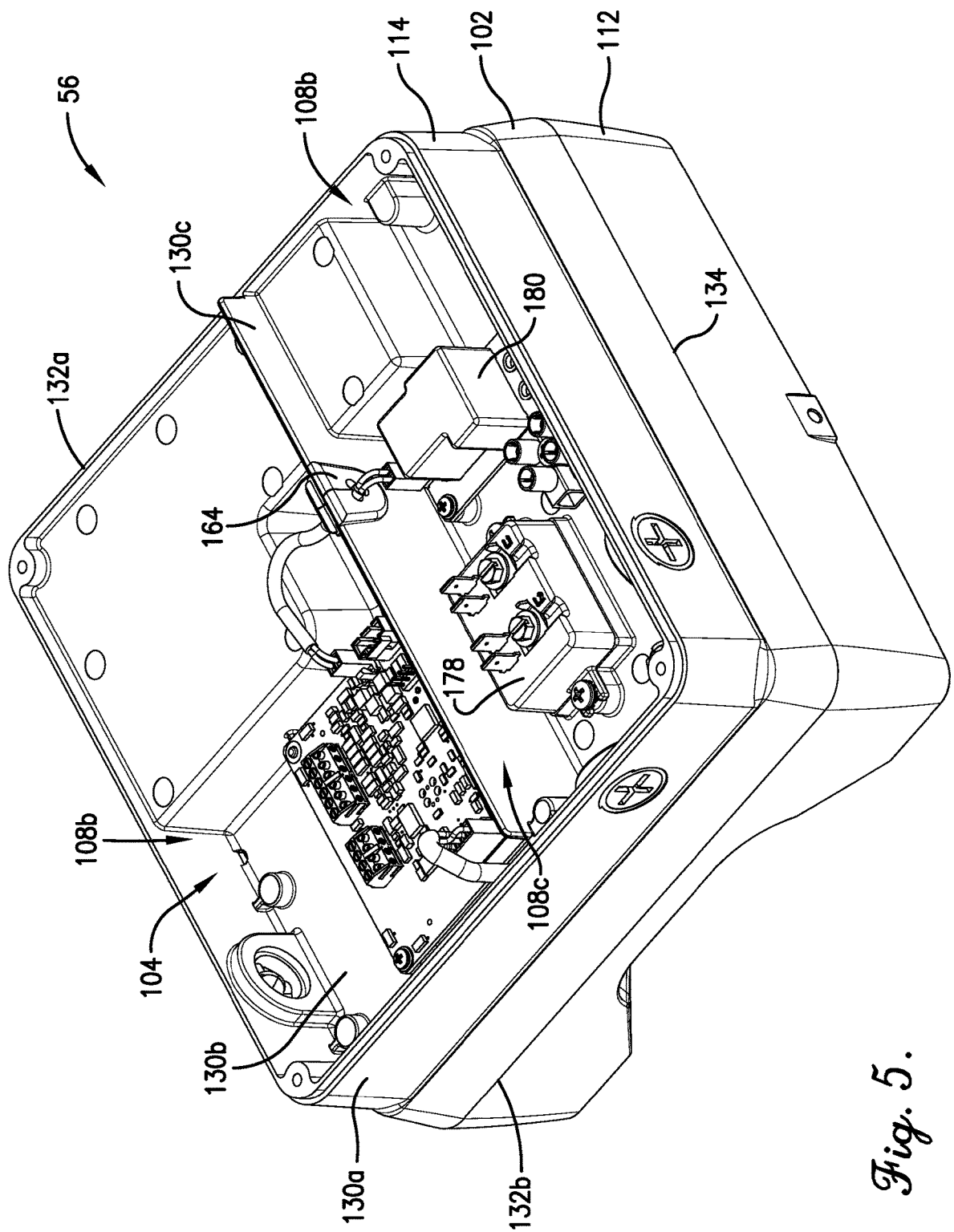
Figure 6:
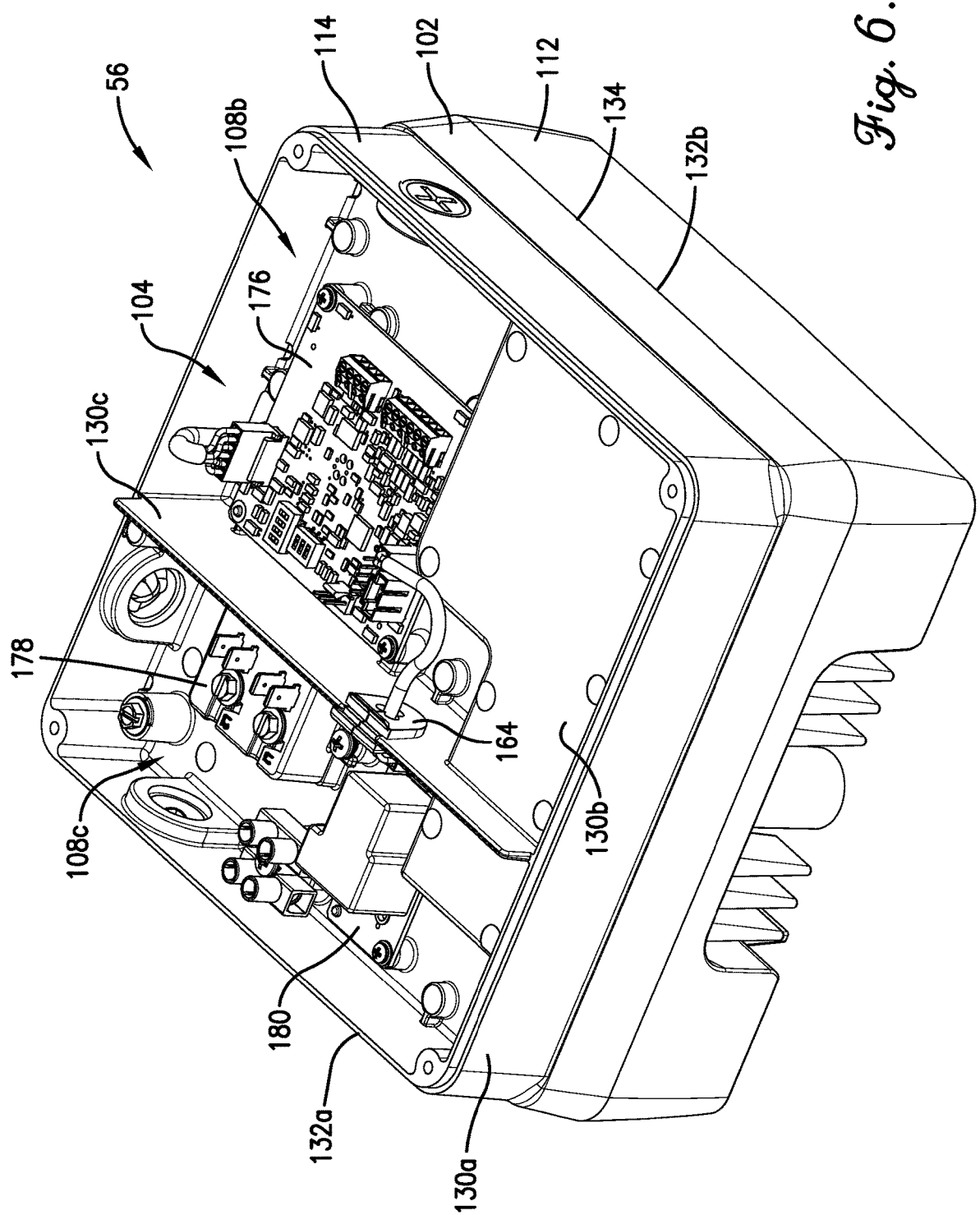
Figure 7:
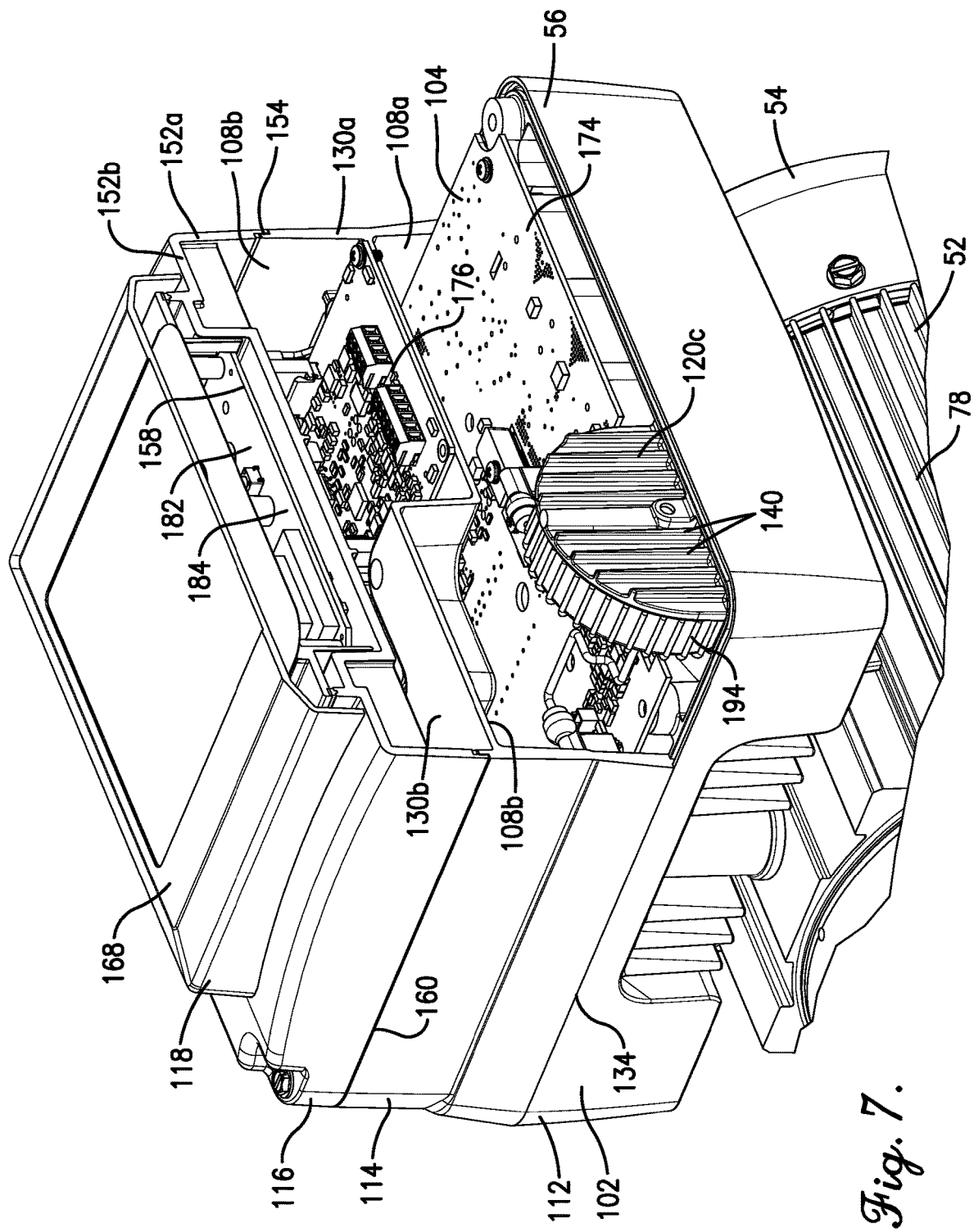
Figure 8:
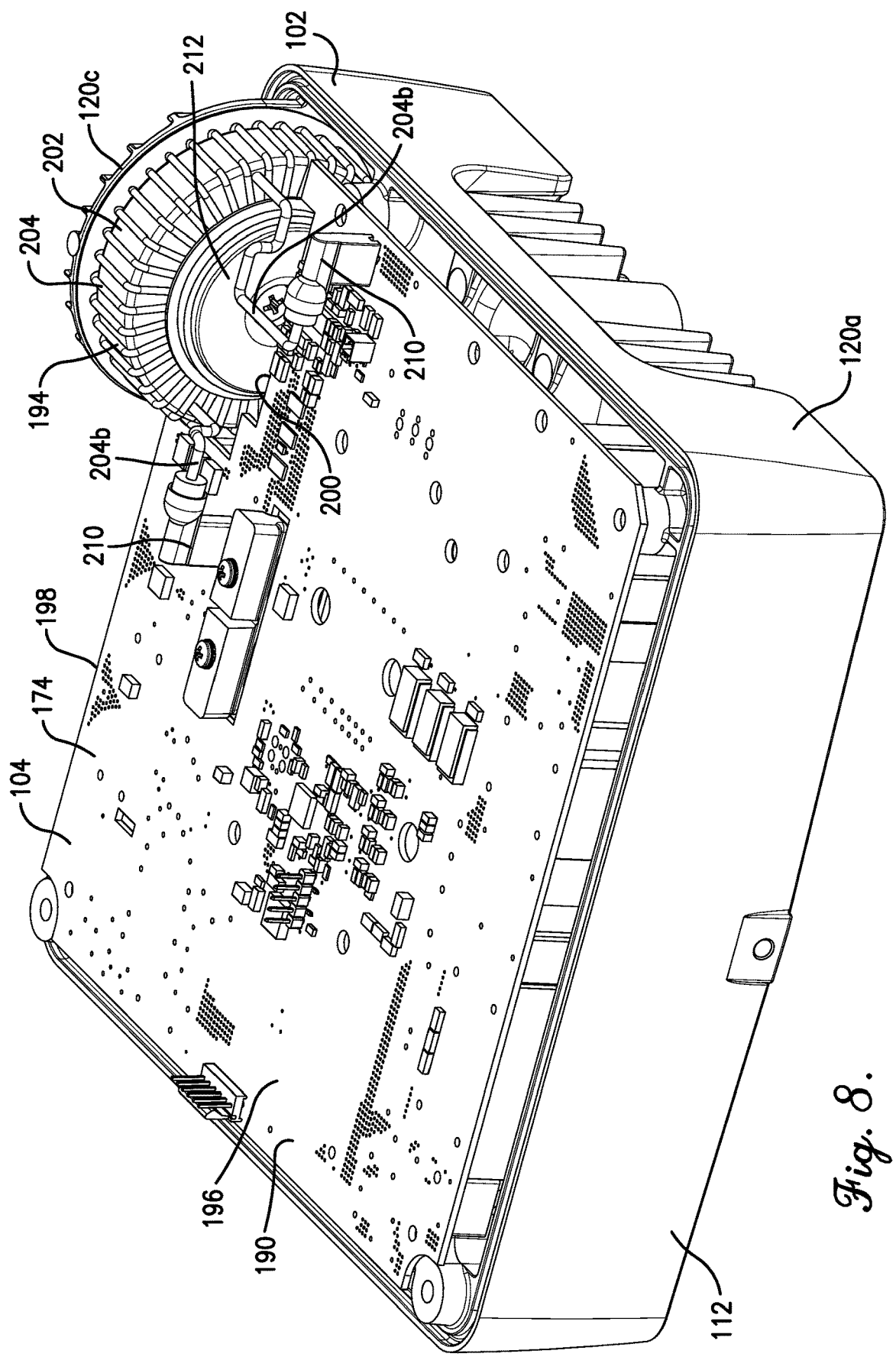
Figure 9:
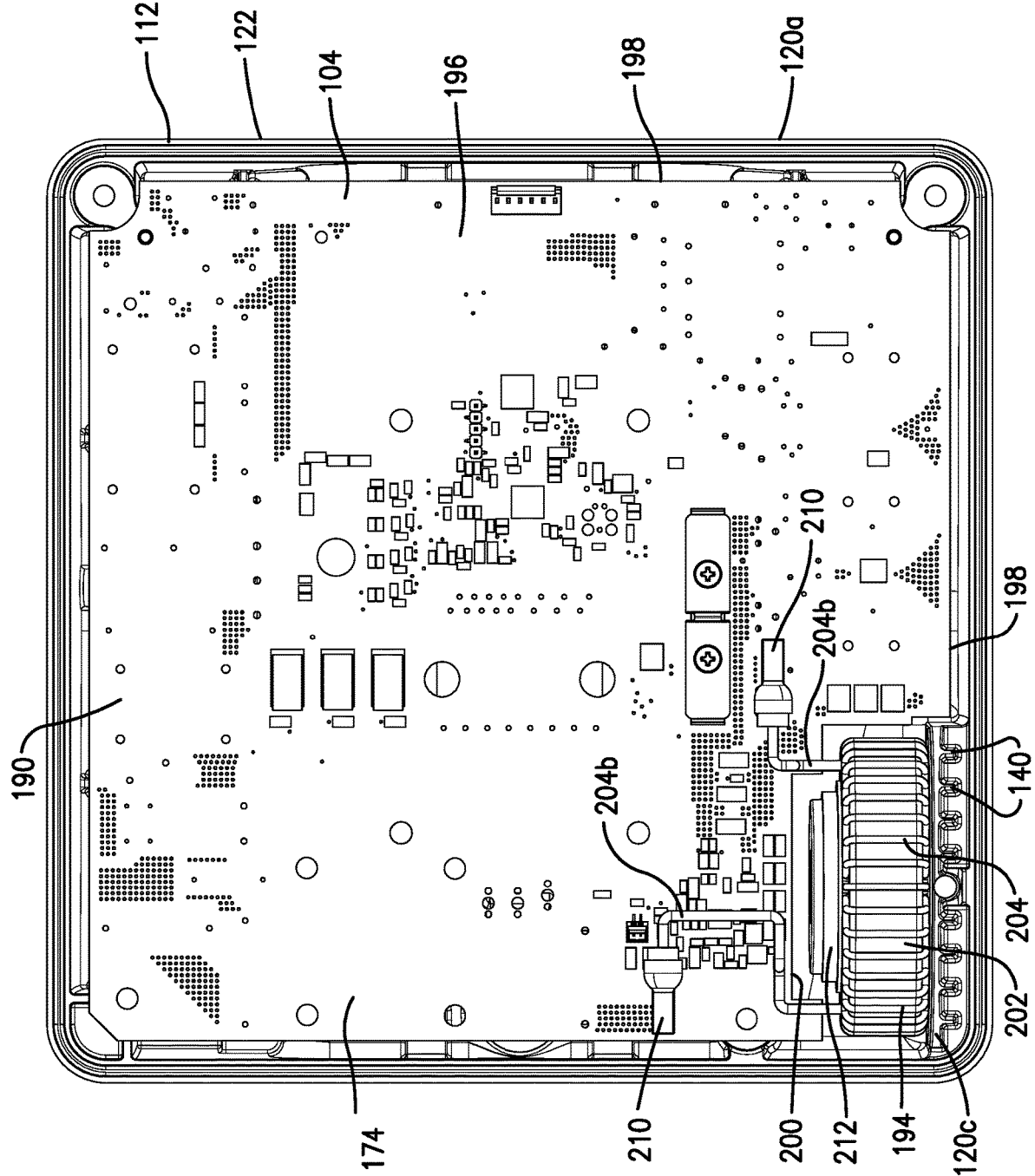
Figure 10:
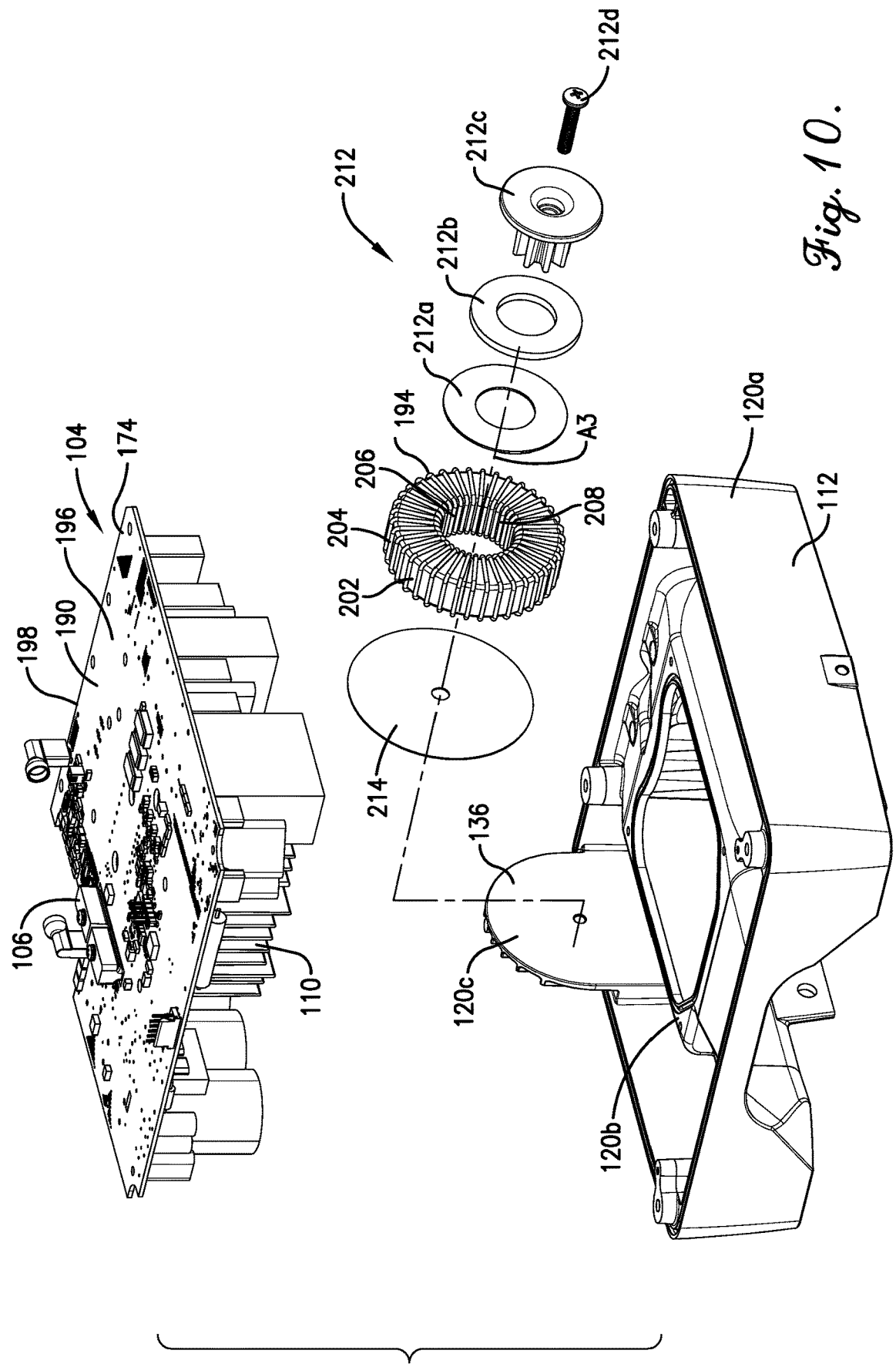
Figure 11:
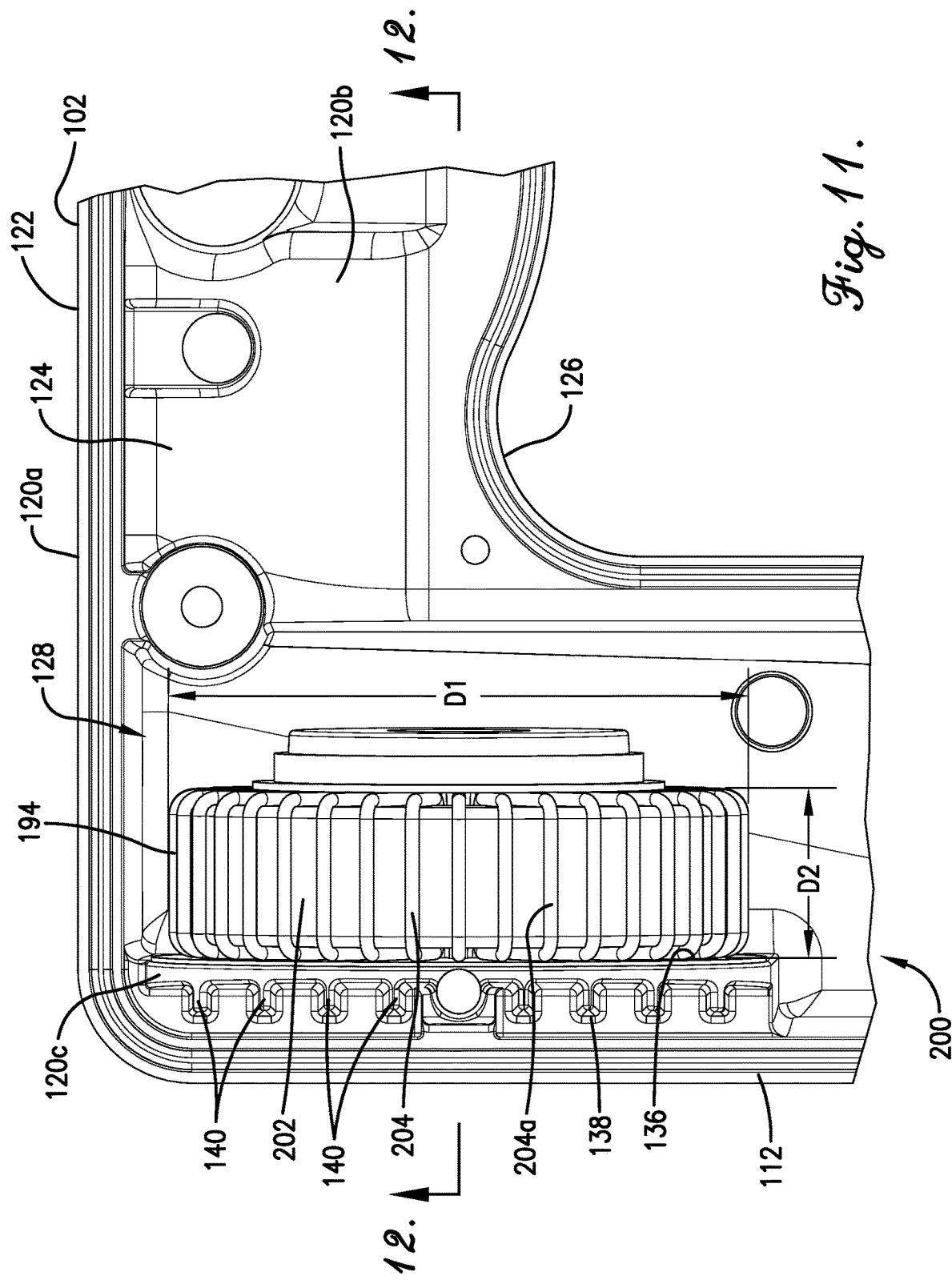
Figure 12:
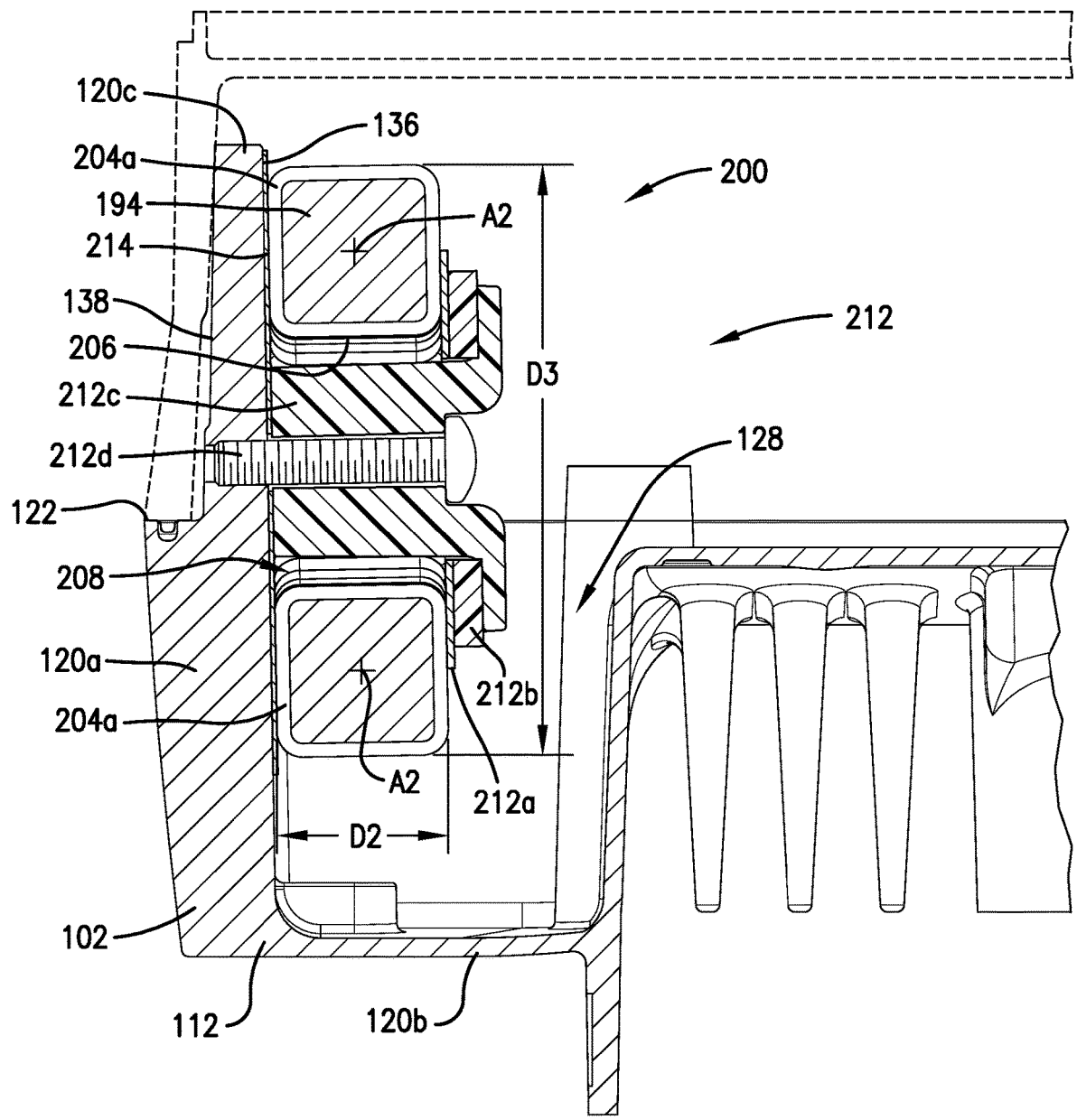
Figure 13:
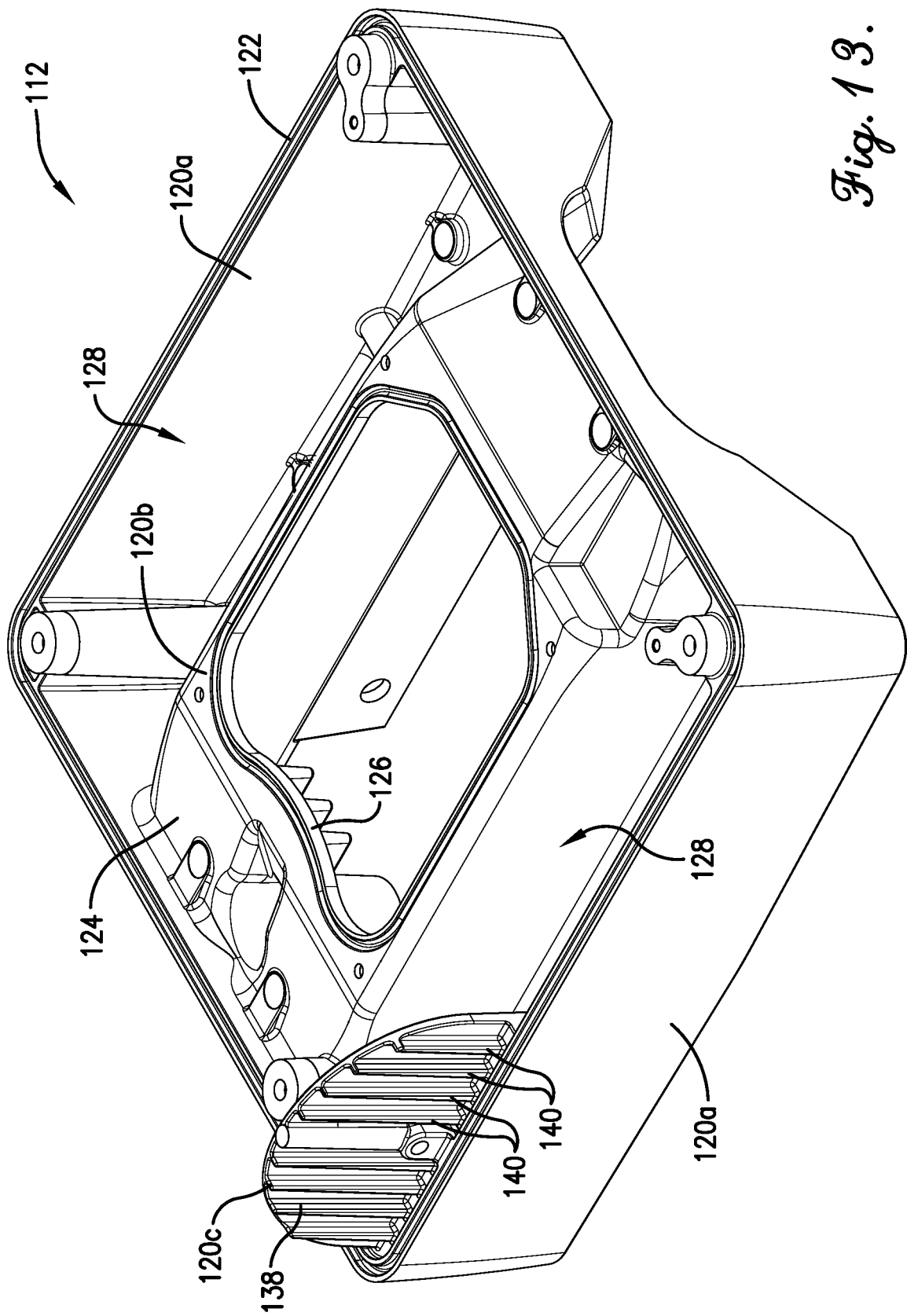
Figure 14:
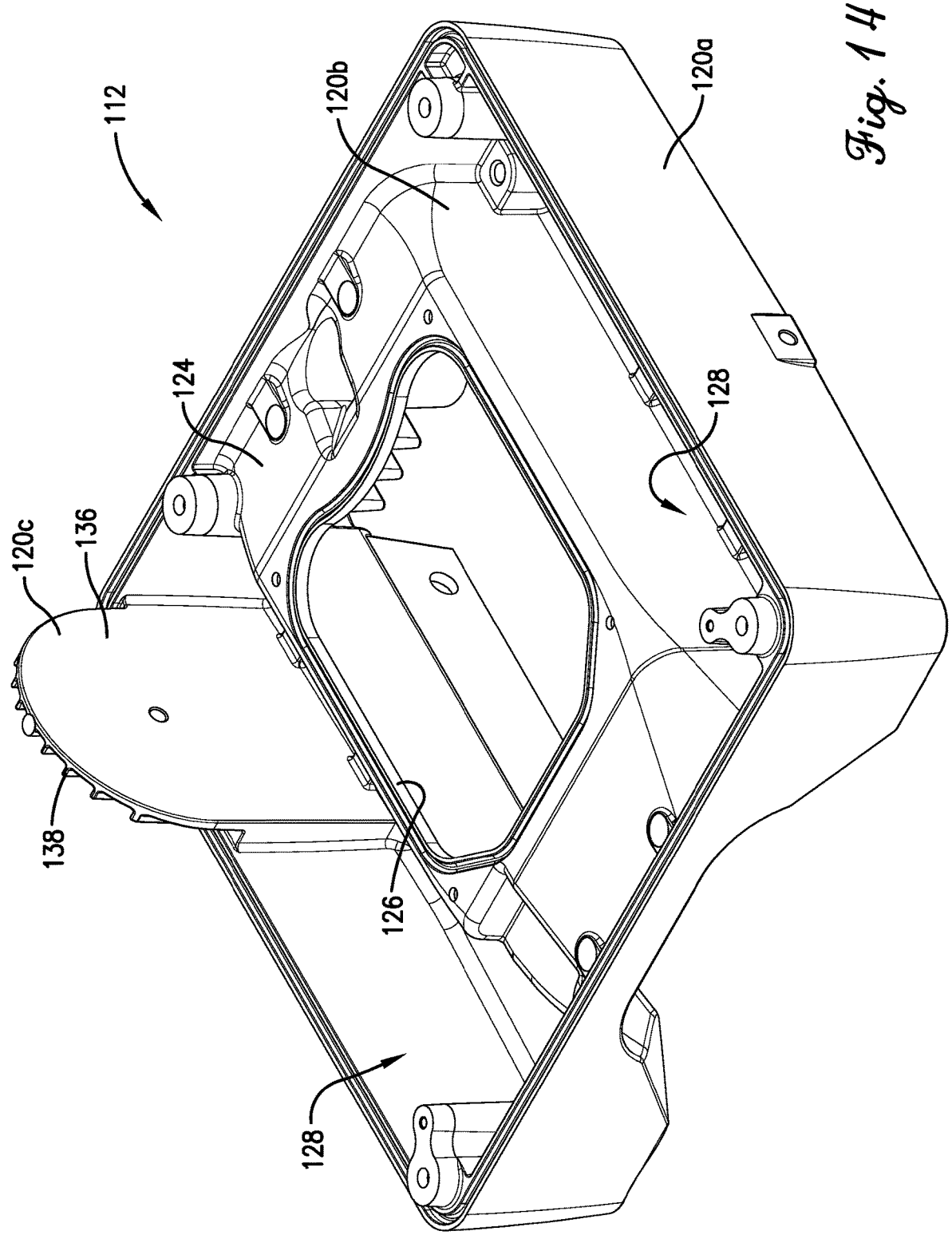
Figure 15:
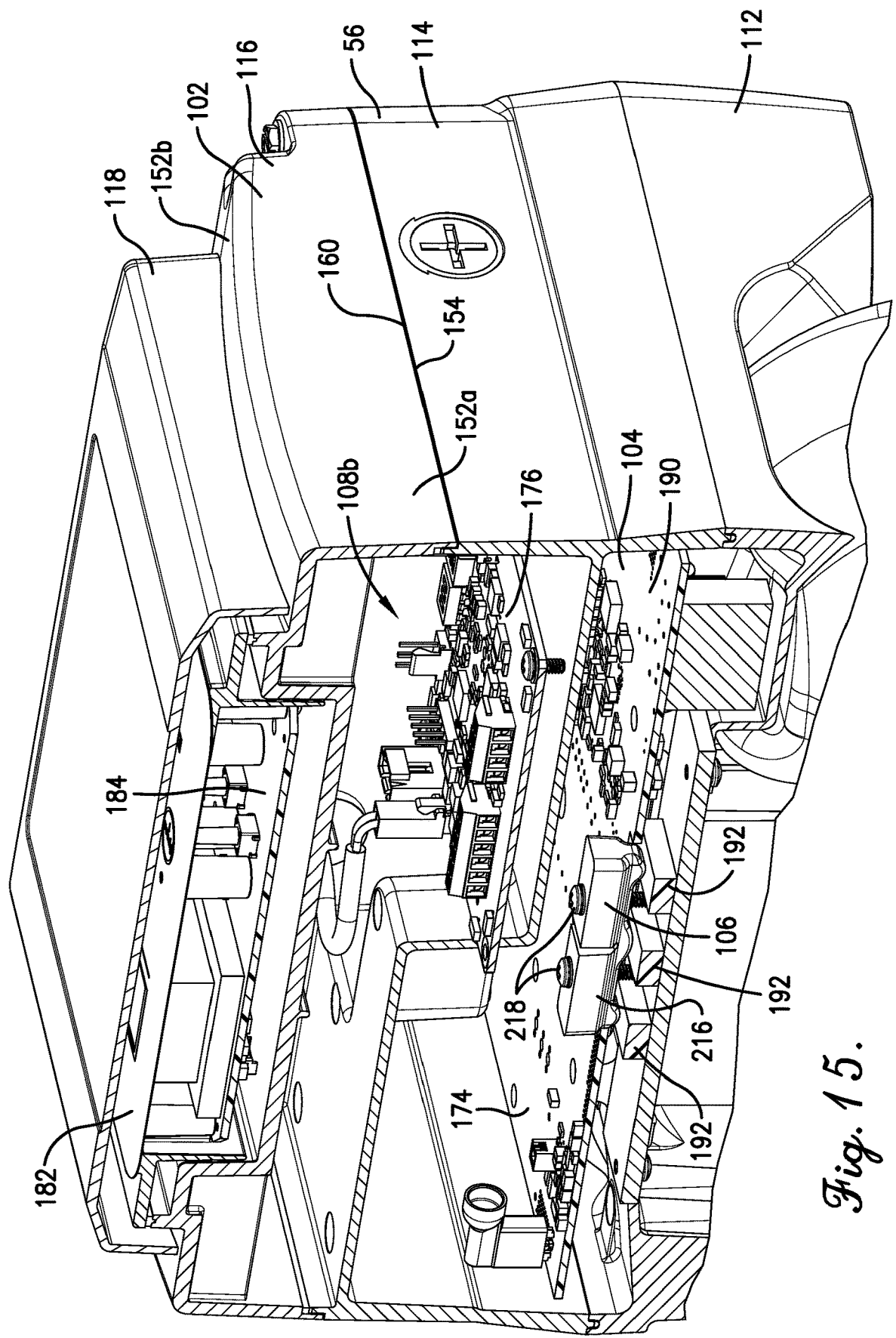
Figure 16:
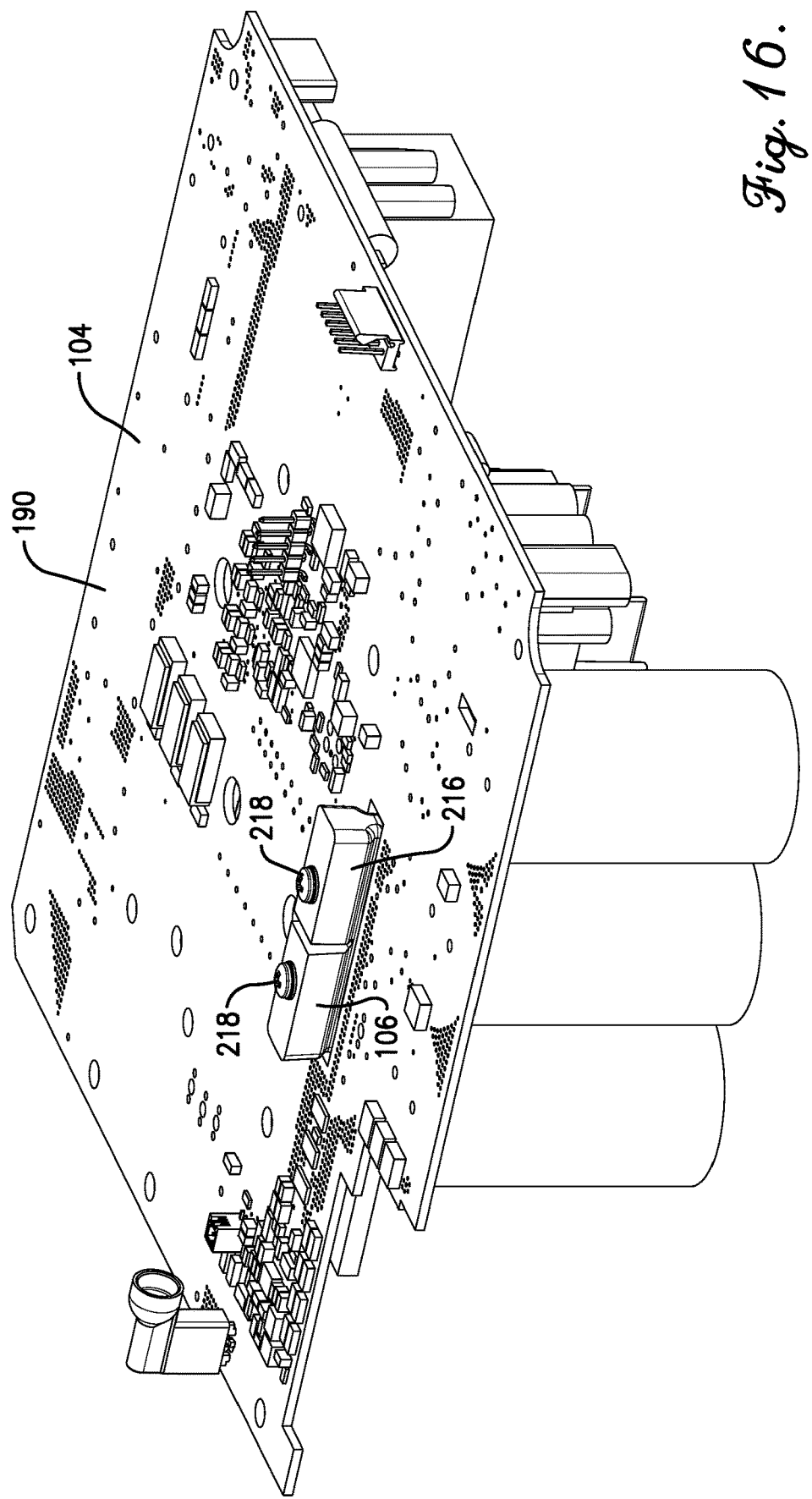
Figure 17:
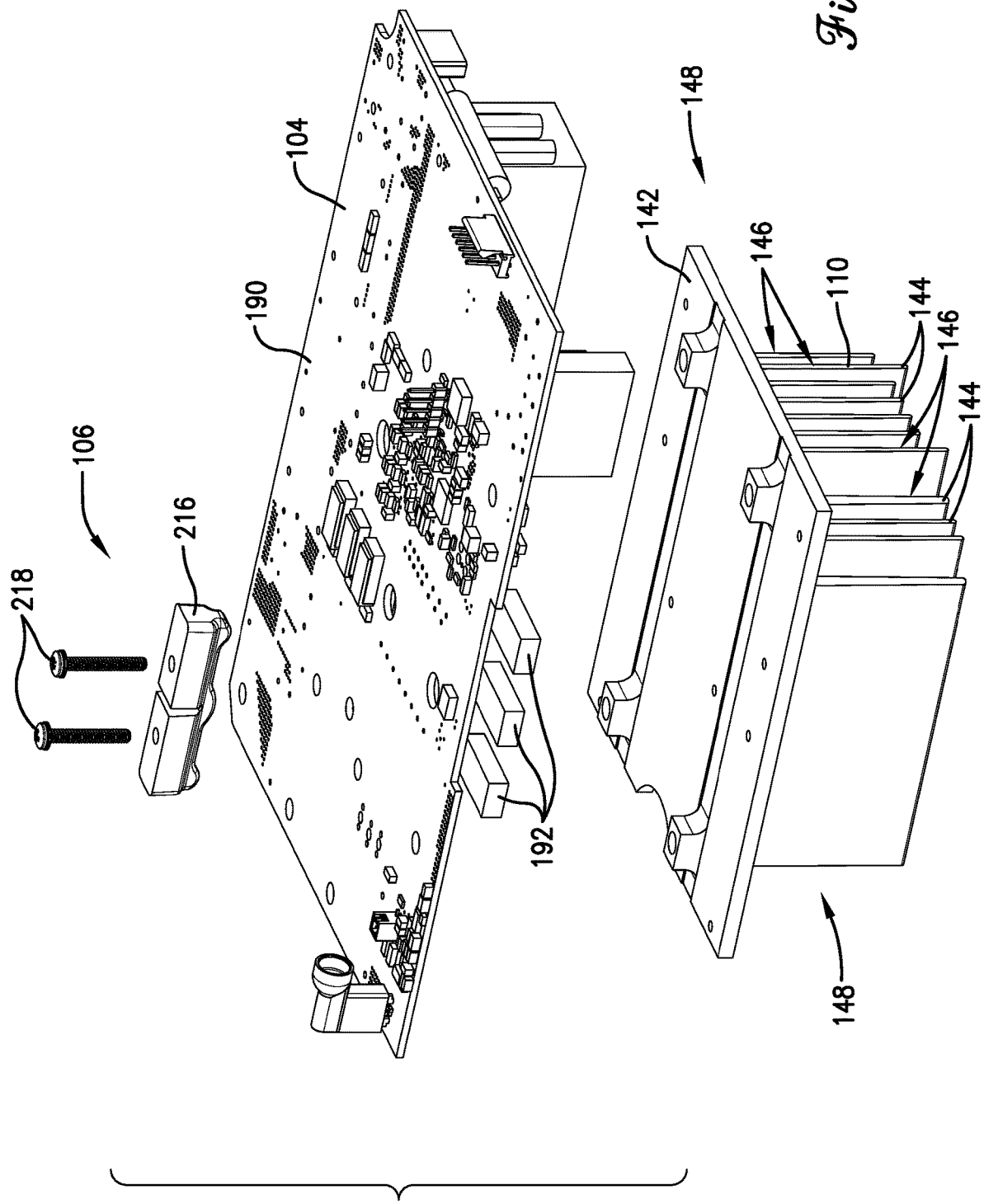
Figure 18:
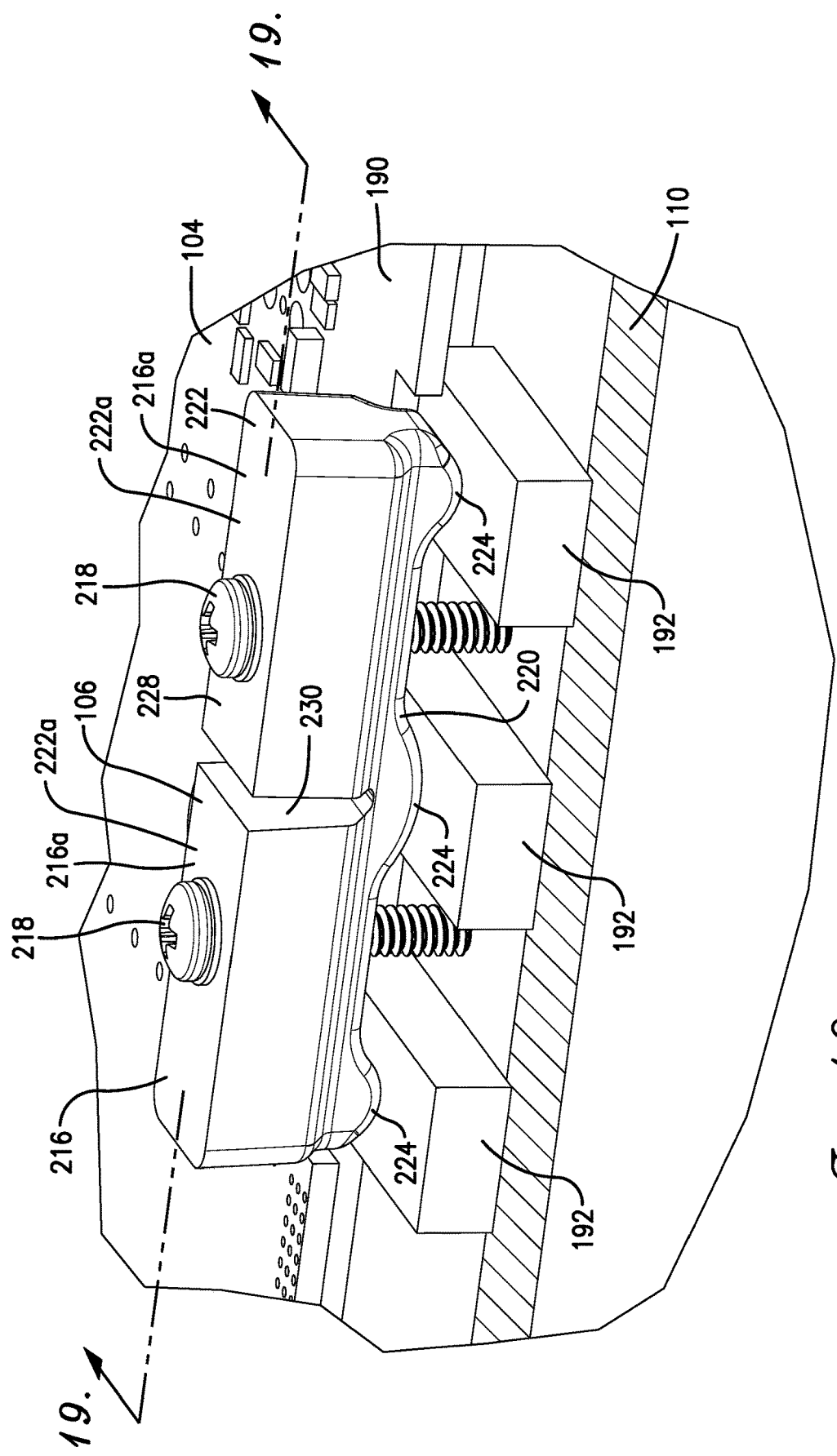
Figure 19:
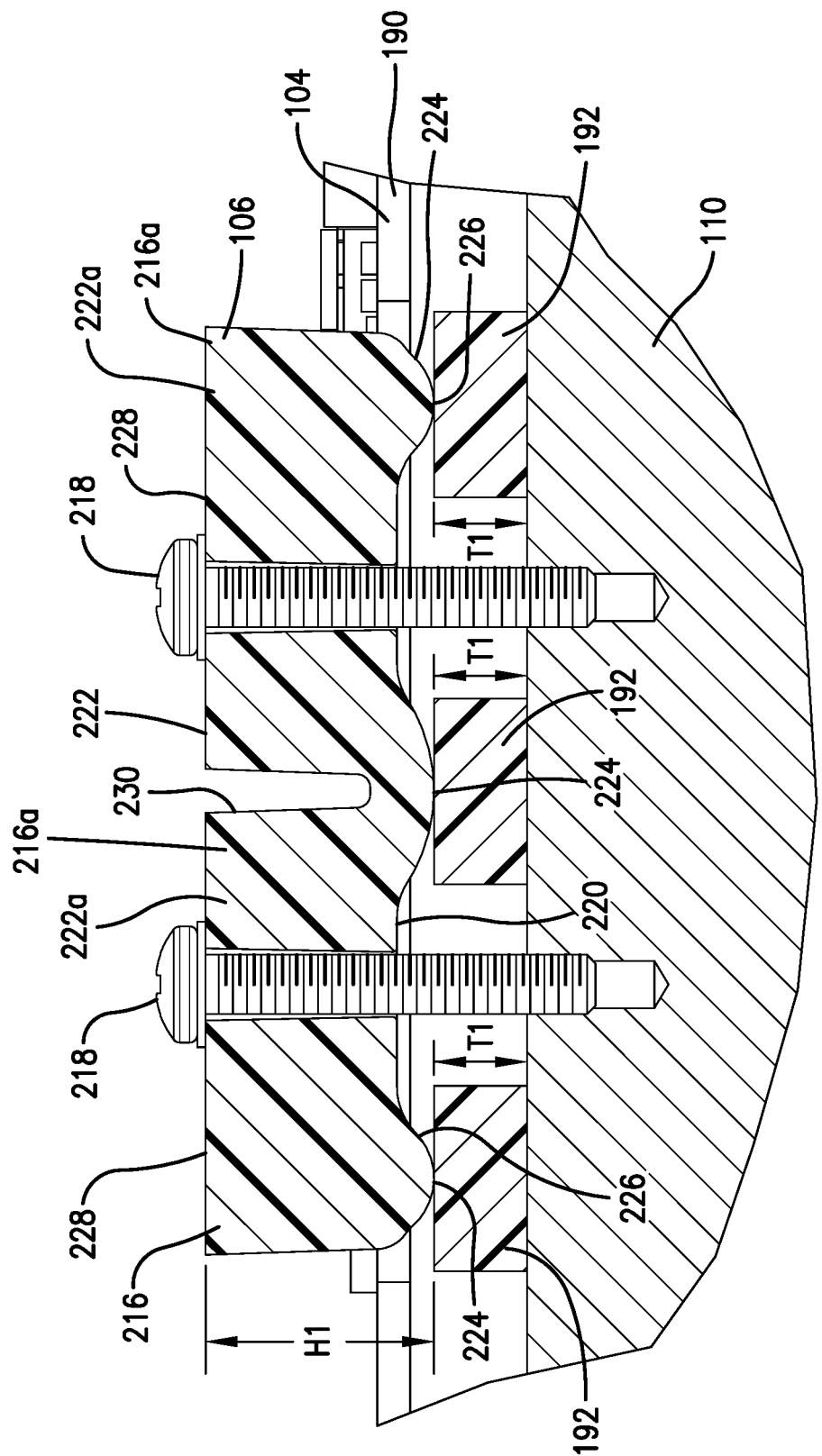
Figure 24:
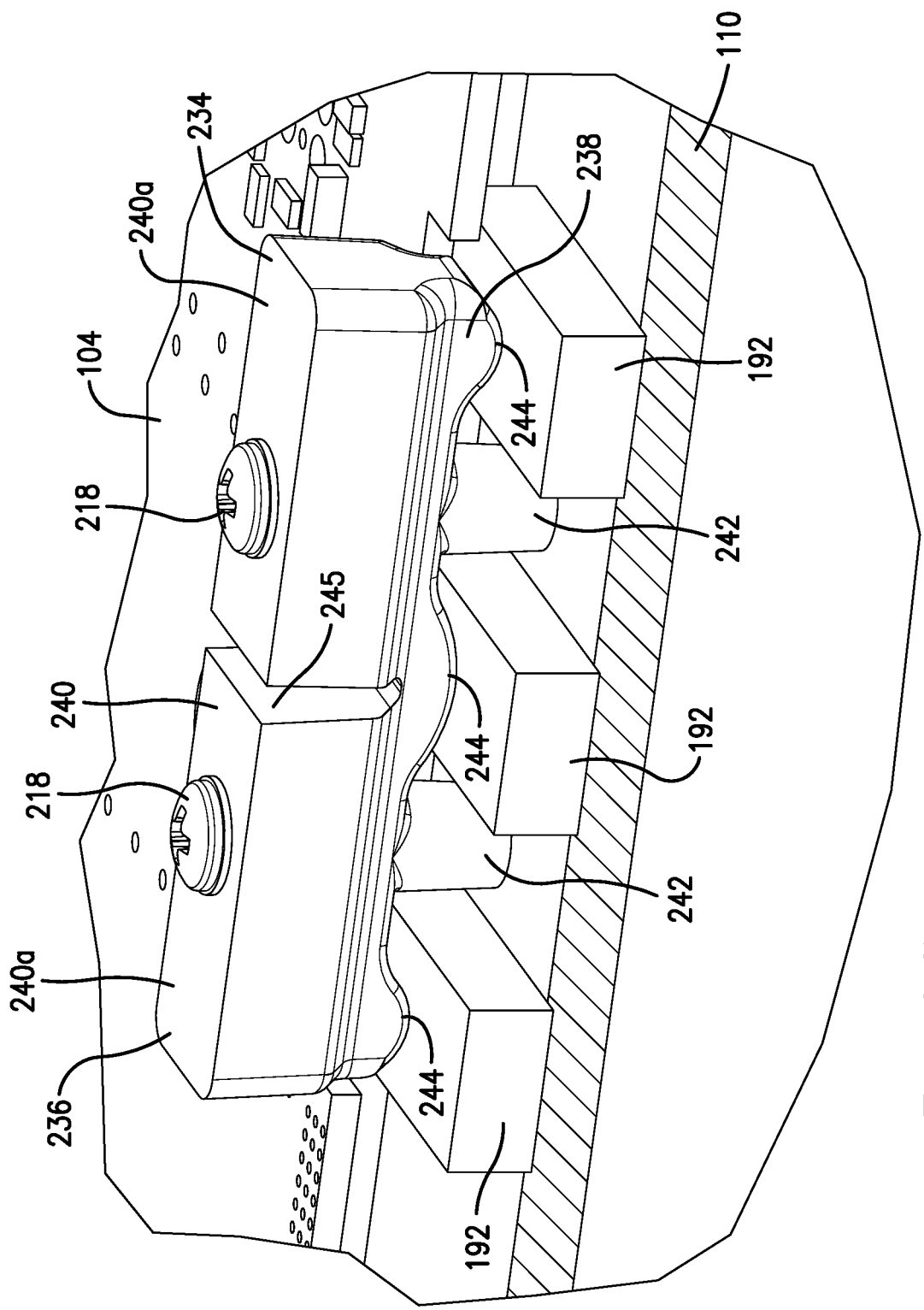
Figure 29:
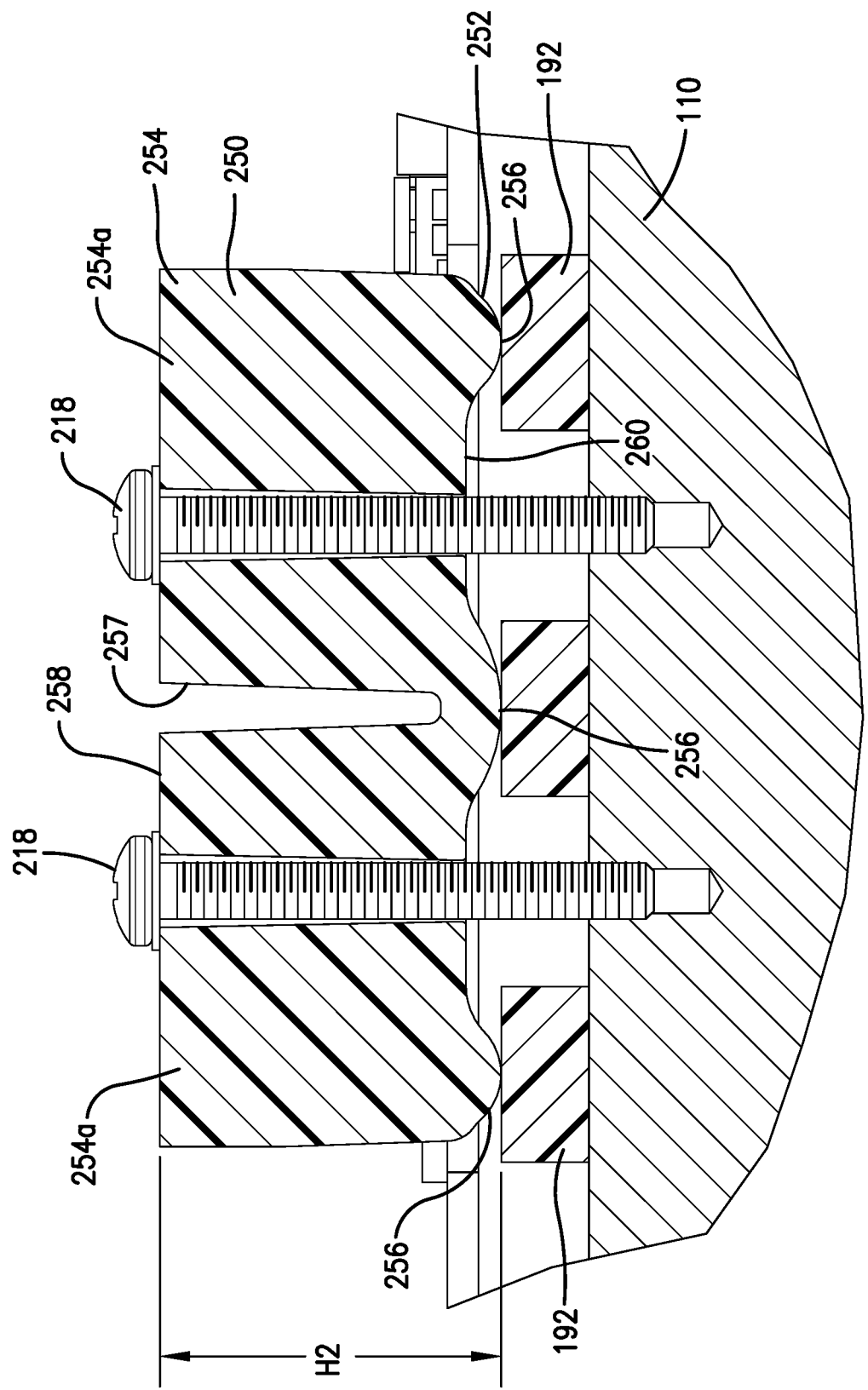
Figure 32:
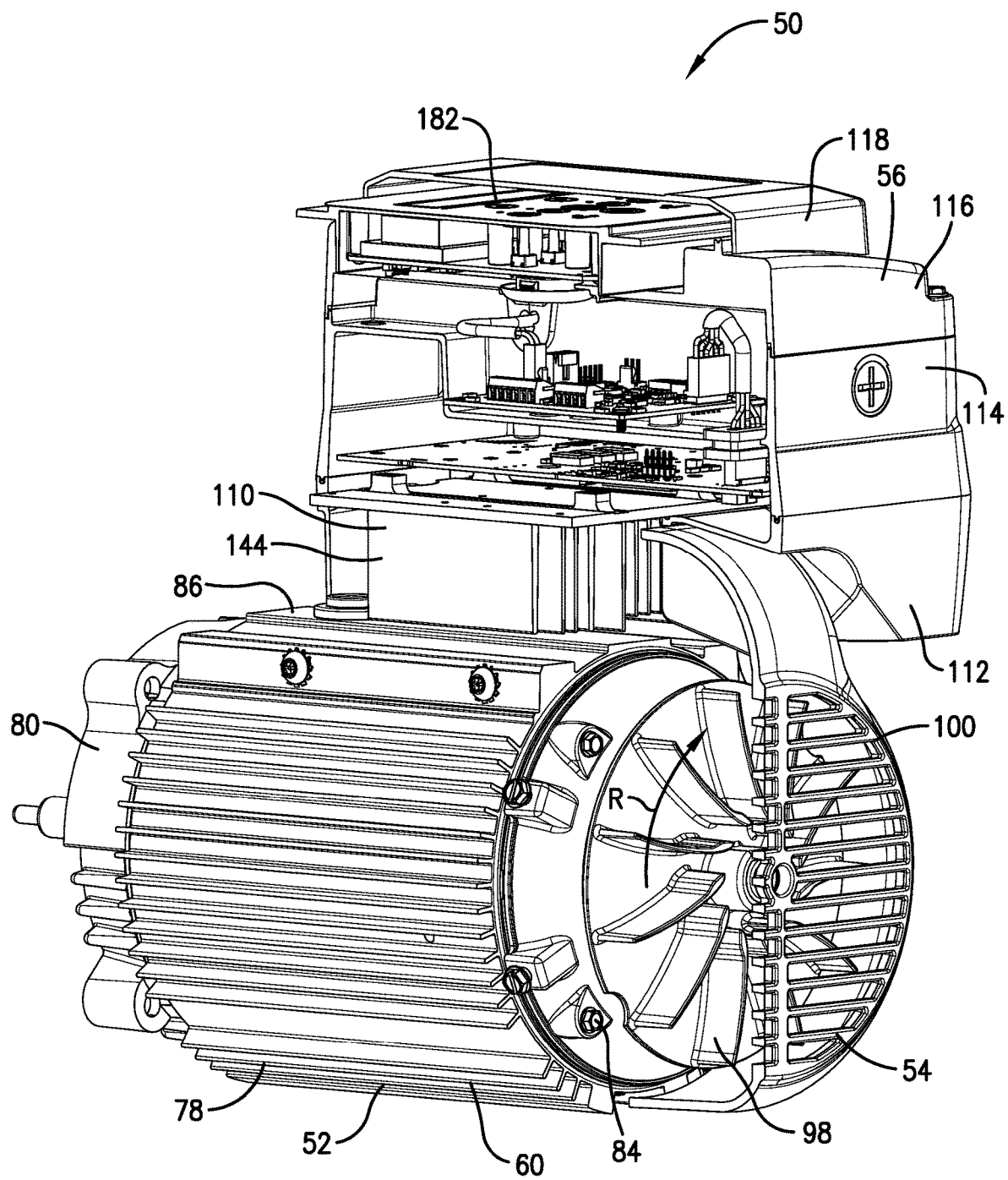
Figure 33:
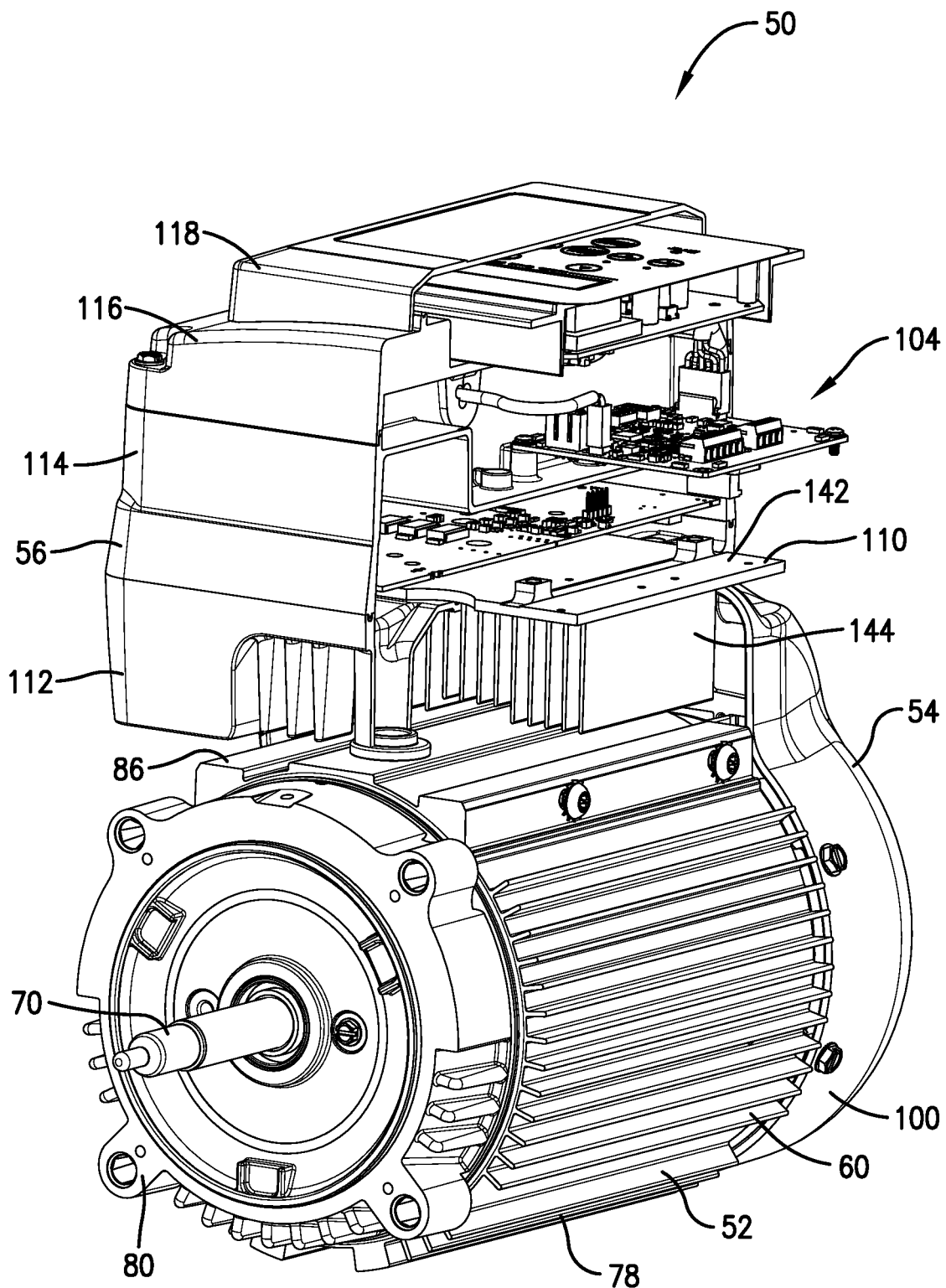
Figure 34:
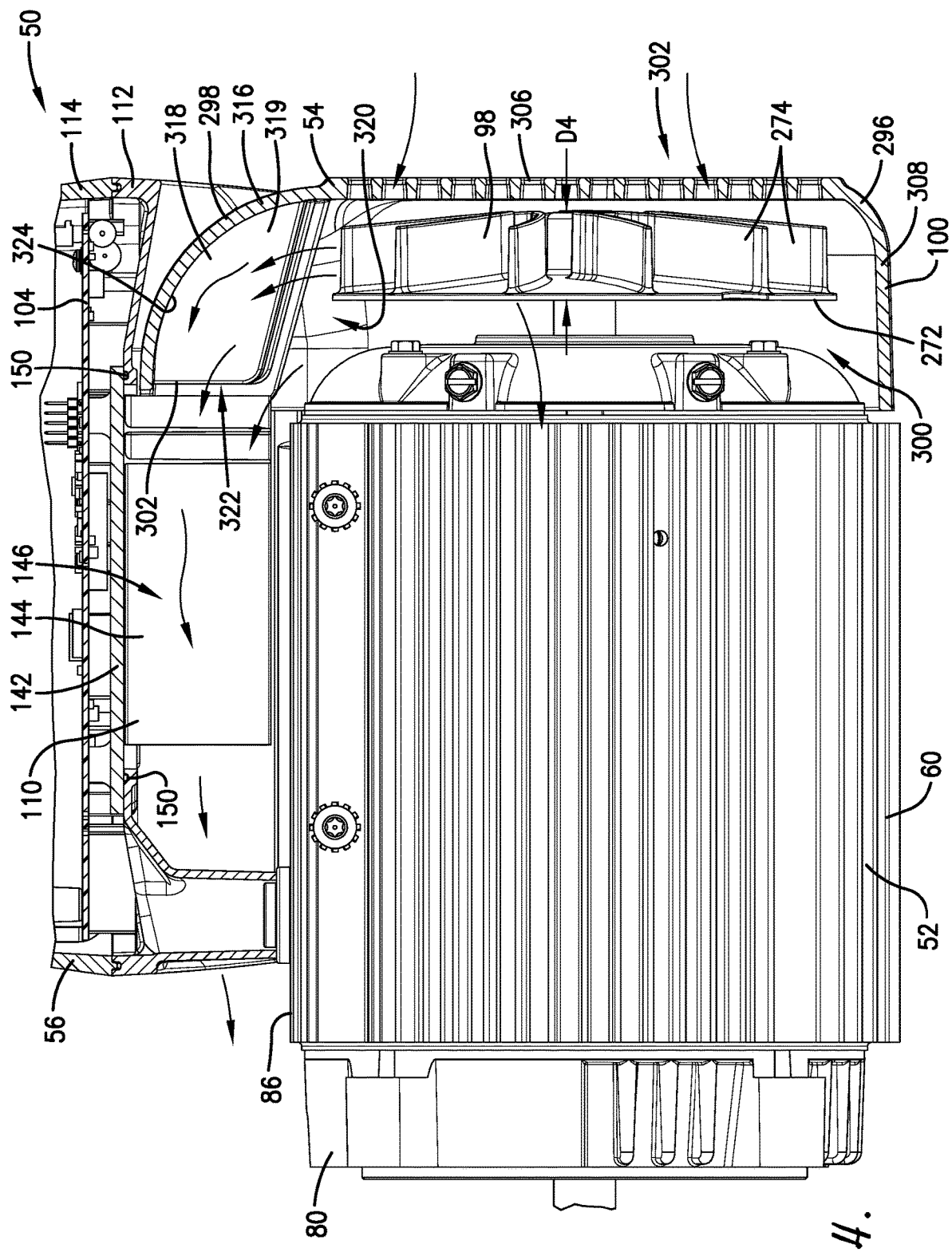
Figure 35:
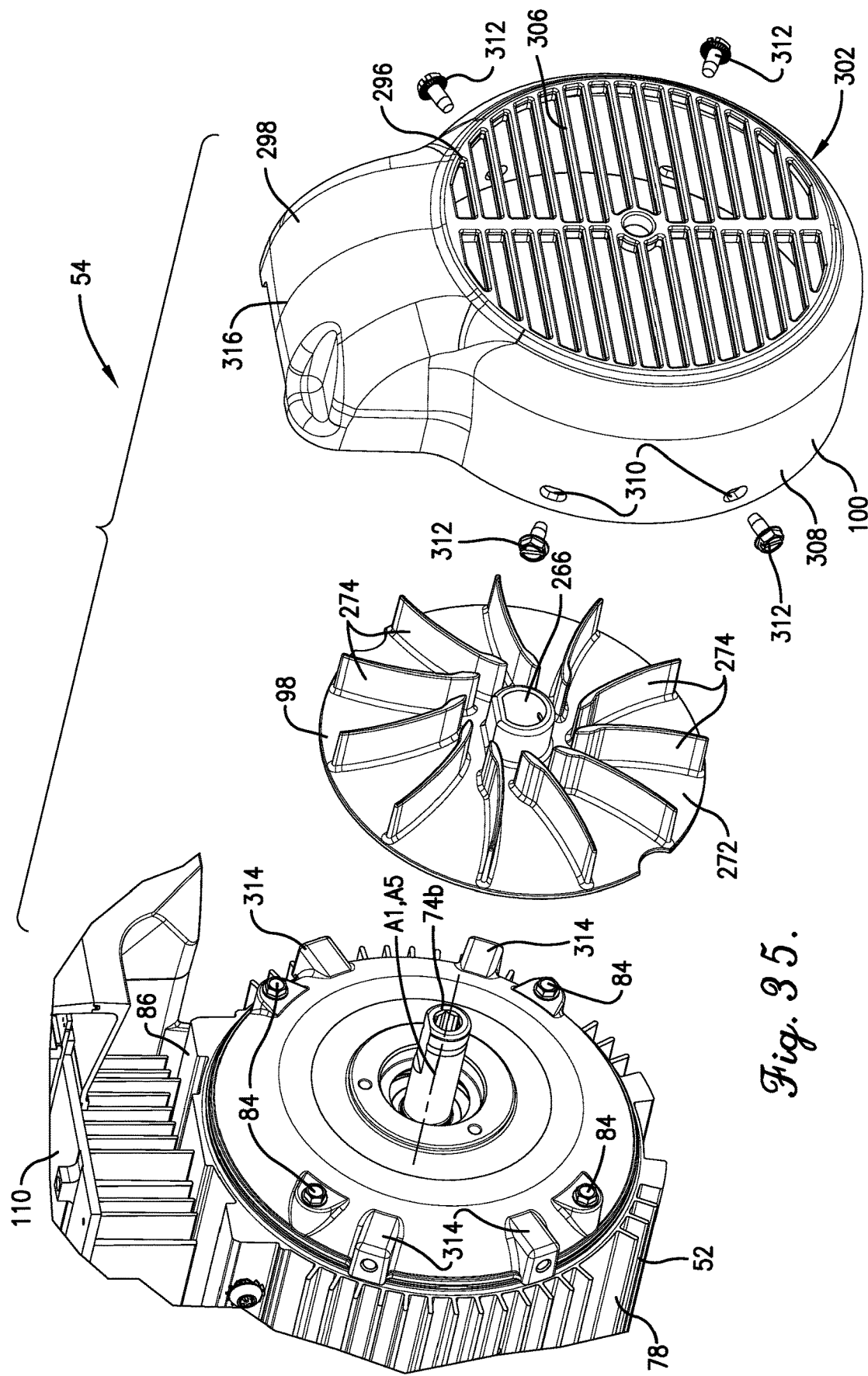
Figure 37:
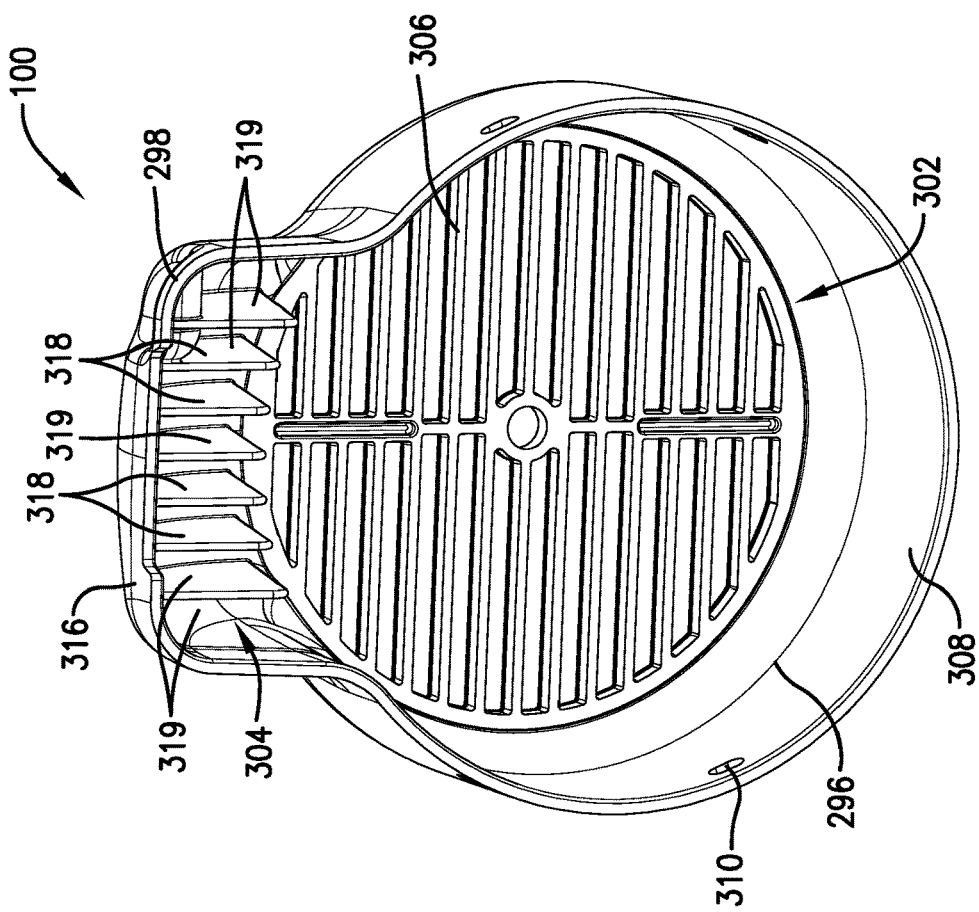
Figure 36:
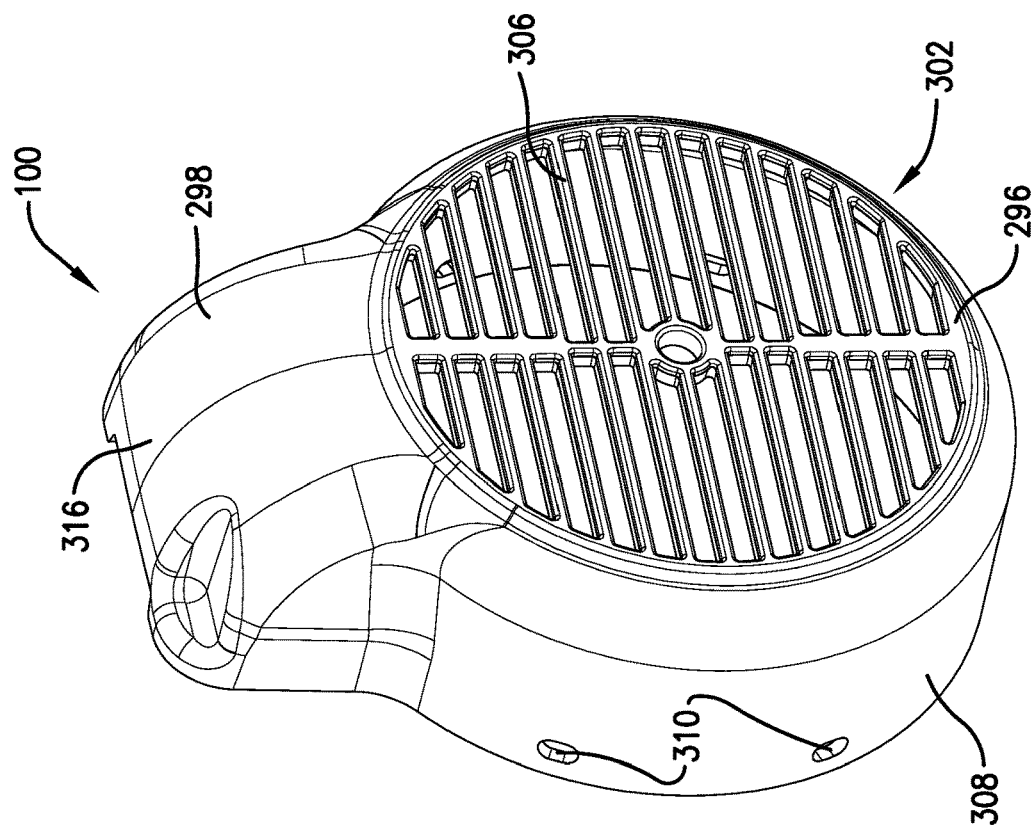
Figure 40:
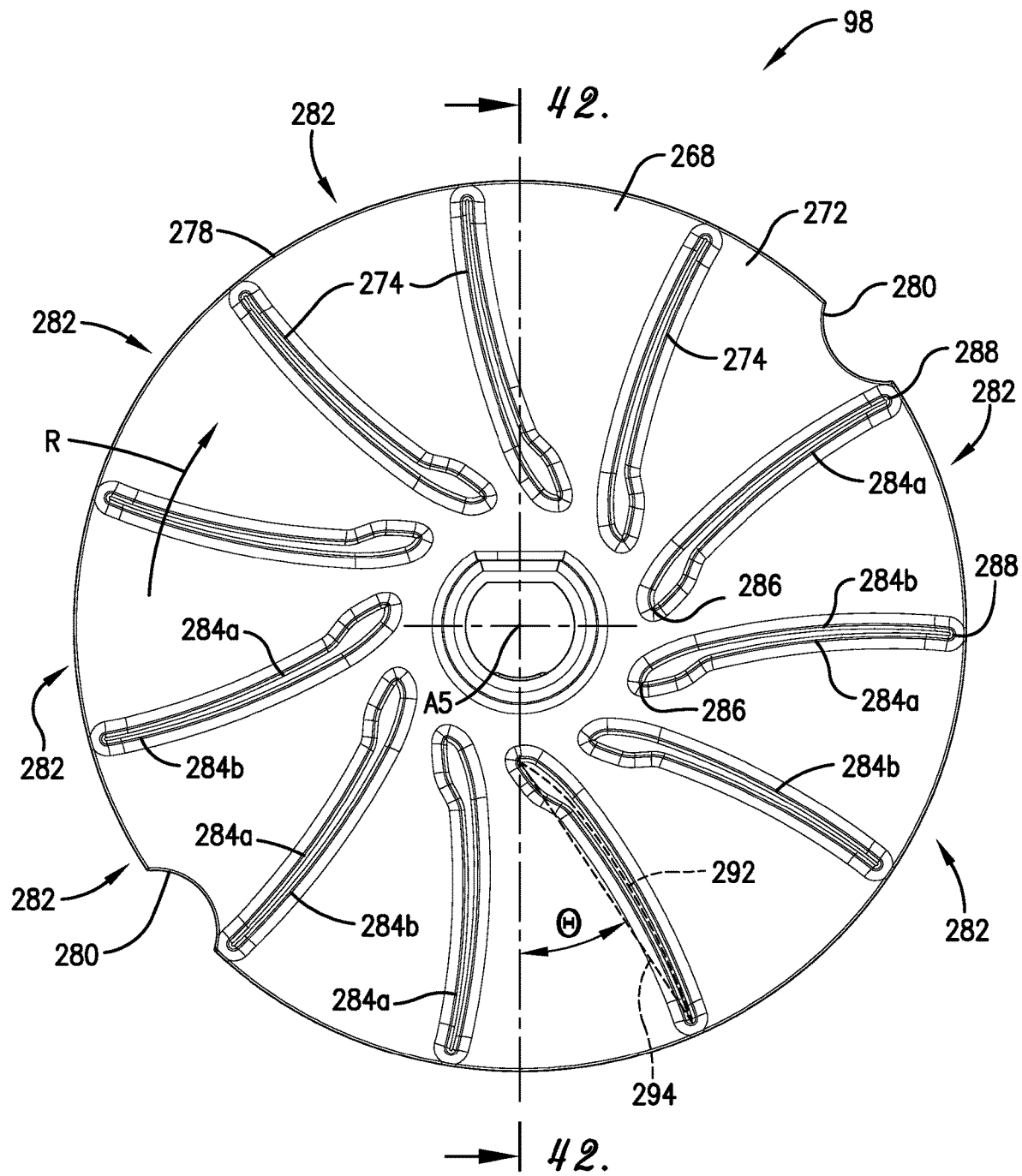

FIG. 4 is a fragmentary perspective of the control housing and motor controller similar to FIG. 3, but taken from the opposite side, depicting a cover of the user interface housing opened to provide access to a user interface, and showing the control housing cross-sectioned to depict a power factor correction circuit board, a drive interface board, a high-voltage interface, and the user interface of the motor controller;

FIG. 5 is a fragmentary upper perspective of the control housing and motor controller shown in FIGS. 3 and 4, showing the upper housing section and user interface housing removed to depict the middle housing section, with the middle housing section including a dividing wall to define a low-voltage chamber that receives the drive interface board and a high-voltage chamber that receives the high-voltage interface and a relay board;

FIG. 6 is a fragmentary upper perspective of the control housing and motor controller similar to FIG. 5, but taken from the opposite side, with the dividing wall supporting a grommet to provide a feedthrough location, and showing a wire harness passing through the grommet to extend between the low-voltage chamber and the high-voltage chamber;

FIG. 7 is a fragmentary perspective of the electric motor assembly similar to FIG. 3, but taken from the opposite end of the electric motor, showing a control board and an inductor of the power factor correction circuit board mounted within a lower controller chamber;

FIG. 8 is a fragmentary upper perspective of the control housing and motor controller, but showing the middle housing section, upper housing section, and user interface housing removed, with the lower housing section receiving the power factor correction circuit board;

FIG. 9 is a fragmentary top view of the control housing and motor controller as shown in FIG. 8, particularly depicting the inductor positioned in an open space defined partly by the control board, with the inductor fastener assembly securing the inductor to an upright inductor wall;

FIG. 10 is a fragmentary exploded perspective of the control housing and motor controller shown in FIGS. 8 and 9, with the inductor fastener assembly including an insulation pad, silicone washer, spacer, and threaded fastener;

FIG. 11 is a fragmentary top view of the control housing and motor controller shown in FIGS. 8-10, showing the inductor secured to the upright inductor wall by the inductor fastener assembly;

FIG. 12 is a fragmentary cross section of the control housing and motor controller taken along line 12-12 of FIG. 11;

FIG. 13 is an upper perspective of the lower housing section shown in FIGS. 8-12;

FIG. 14 is an upper perspective of the lower housing section similar to FIG. 13, but taken from the opposite side;

FIG. 15 is a fragmentary perspective of the control housing and motor controller shown in FIG. 3, showing the power factor correction circuit board attached to a heat sink of the control housing, with heat-generating electrical components of the control board being clamped against the heat sink by a clamp assembly;

FIG. 16 is a fragmentary perspective of the heat sink and motor controller shown in FIGS. 3 and 15, showing the clamp assembly secured to the heat sink and spaced within a perimeter of the control board;

FIG. 17 is a fragmentary perspective of the heat sink and motor controller similar to FIG. 16, but showing the clamp assembly and heat sink exploded from the control board;

FIG. 18 is an enlarged fragmentary perspective of the heat sink and motor controller shown in FIGS. 3 and 15-17, showing a clamp bar and fasteners of the clamp assembly;

FIG. 19 is a fragmentary cross section of the heat sink and motor controller taken along line 19-19 in FIG. 18, with the clamp bar including a clamp margin and backing flange, and showing projections of the clamp margin engaging respective electrical components;

FIG. 20 is a fragmentary cross section of the heat sink and motor controller similar to FIG. 19, but showing a first alternative set of heat-generating electrical components secured to the heat sink by the clamp assembly, with the clamp bar flexing so that the projections engage the respective electrical components;

FIG. 21 is a fragmentary cross section of the heat sink and motor controller similar to FIG. 20, but showing a second alternative set of heat-generating electrical components secured to the heat sink by the clamp assembly, with the clamp bar flexing in the opposite direction compared to FIG. 20 so that the projections engage the respective electrical components;

FIG. 22 is an upper perspective of the clamp bar shown in FIGS. 3 and 15-21;

FIG. 23 is a lower perspective of the clamp bar shown in FIGS. 3 and 15-22;

FIG. 24 is an enlarged fragmentary perspective of the heat sink and motor controller similar to FIG. 18, but showing a first alternative clamp assembly embodiment securing the electrical components against the heat sink;

FIG. 25 is a fragmentary cross section of the heat sink and motor controller shown in FIG. 24, with the alternative clamp bar including a clamp margin, backing flange, and spacers, and showing projections of the clamp margin engaging respective electrical components;

FIG. 26 is an upper perspective of the alternative clamp bar shown in FIGS. 24 and 25;

FIG. 27 is a lower perspective of the alternative clamp bar shown in FIGS. 24-26;

FIG. 28 is an enlarged fragmentary perspective of the heat sink and motor controller similar to FIG. 18, but showing a second alternative clamp assembly embodiment securing the electrical components against the heat sink;

FIG. 29 is a fragmentary cross section of the heat sink and motor controller shown in FIG. 28, with the alternative clamp bar including a clamp margin and backing flange, and showing projections of the clamp margin engaging respective electrical components;

FIG. 30 is an upper perspective of the alternative clamp bar shown in FIGS. 28 and 29;

FIG. 31 is a lower perspective of the alternative clamp bar shown in FIGS. 28-30;

FIG. 32 is a fragmentary perspective of the electric motor assembly shown in FIG. 1, with the motor fan assembly including a radial fan and a fan guard, and showing the control housing and the fan guard cross-sectioned, with the radial fan rotatably received in a fan chamber defined between the fan guard and the motor housing;

FIG. 33 is a fragmentary perspective of the electric motor assembly similar to FIG. 32, but taken from the opposite end of the electric motor;

FIG. 34 is a fragmentary side elevation of the electric motor assembly shown in FIG. 32, with the radial fan drawing air axially into the fan chamber and directing airflow radially outwardly to an air scoop of the fan guard, with the air scoop turning the airflow axially to flow through the heat sink and along the exterior motor surface;

FIG. 35 is a fragmentary exploded perspective of the electric motor assembly shown in FIGS. 32-34;

FIG. 36 is a perspective of the fan guard shown in FIGS. 32-35, with the fan guard including the air scoop;

FIG. 37 is a perspective of the fan guard similar to FIG. 36, but taken from the opposite side;

FIG. 38 is a perspective of the radial fan shown in FIGS. 32-35, with the radial fan including a hub and wheel;

FIG. 39 is a perspective of the radial fan similar to FIG. 38, but taken from the opposite side;

FIG. 40 is a front elevation of the radial fan shown in FIGS. 38 and 39, showing a wheel plate and blades of the wheel, and depicting the rotational direction of the radial fan;

FIG. 41 is a side elevation of the radial fan shown in FIGS. 38-40; and

FIG. 42 is a cross section of the radial fan taken along line 42-42 of FIG. 40.

The drawing figures do not limit the present invention to the specific embodiments disclosed and described herein. While the drawings do not necessarily provide exact dimensions or tolerances for the illustrated components or structures, the drawings, not including any purely schematic drawings, are to scale with respect to the relationships between the components of the structures illustrated therein.

DETAILED DESCRIPTION OF THE PREFERRED EMBODIMENTS

Figure 2:
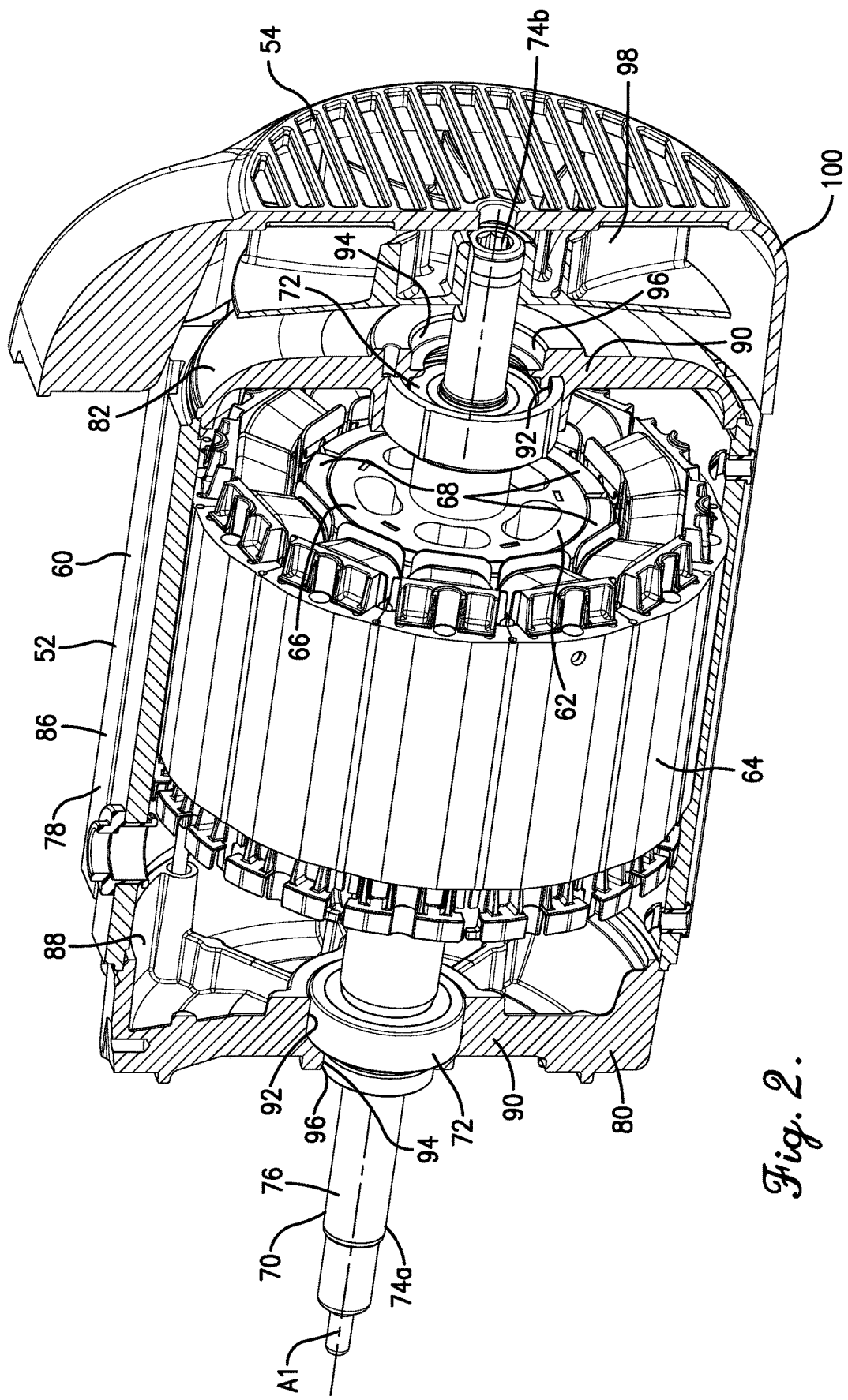
FIG. 2 is a fragmentary perspective of the electric motor and motor fan assembly shown in FIG. 1, with the motor housing and the motor fan assembly cross-sectioned to show components inside the motor housing and the motor fan assembly.

Turning to FIGS. 1-3, an electric motor assembly 50 is constructed in accordance with a preferred embodiment of the present invention. The electric motor assembly 50 is particularly configured for extended service in humid or wet environments. The depicted electric motor assembly 50 is preferably operable with a water pump (not shown) to provide a powered pump assembly for a recreational swimming pool. It will be appreciated that the electric motor assembly 50 may alternatively be drivingly attached to another mechanism or machine, without departing from the spirit of certain aspects of the present invention.

The electric motor assembly 50 broadly includes an electric motor 52, a motor fan assembly 54, and a motor control assembly 56. The electric motor assembly 50 is preferably oriented such that a rotational shaft axis A1 extends horizontally. However, it is permissible according to some aspects of the present invention for the motor assembly to be alternatively oriented (e.g., where the shaft axis is arranged vertically).

Electric Motor

The electric motor 52 is configured for use in any suitable environment. The motor 52 broadly includes a housing 60, a rotor 62, and a stator 64 (see FIG. 2). The rotor 62 is preferably rotatable about the rotational shaft axis A1 (see FIG. 2). In preferred embodiments, the stator 64 at least substantially circumscribes the rotor 62, such that the motor 52 is an inner rotor motor. It is permissible according to some aspects of the present invention, however, for the motor to be an outer rotor motor.

The rotor 62 preferably includes a rotor core 66, a plurality of magnets 68, and a shaft 70 defining the shaft axis A1 for the rotor 62. The rotor core 66 and magnets 68 are generally located within the housing 60. The shaft 70 is rotatably supported relative to the motor housing 60 to rotate about the shaft axis A1. More specifically, the shaft 70 is rotatably supported by opposite, axially spaced bearings 72 (see FIG. 2). In the preferred embodiment, the rotor weight is generally shared by the bearings 72.

The shaft 70 preferably includes opposite exposed portions 74a,b that are exposed relative to the motor housing 60 (see FIGS. 2 and 35). The exposed portion 74a is configured to drivingly engage the pump, and the exposed portion 74b is configured to drivingly engage a radial fan (as will be discussed below).

The exposed portions 74a,b are preferably cantilevered relative to the motor housing 60 such that respective free ends of the shaft 70 are spaced from the housing 60 (see FIG. 2). However, for some aspects of the present invention, the shaft could have an exposed portion alternatively located along the length of the shaft (e.g., where the exposed portion is spaced between the ends of the shaft and, more optionally, between bearing supports such that the exposed portion is along a non-cantilevered portion of the shaft).

The depicted shaft 70 presents an outer shaft surface 76 to receive the radial fan (see FIG. 2), such that the exposed shaft portion 47b supports the fan. However, according to some aspects of the present invention, the fan may be indirectly driven by the rotor shaft (e.g., a transmission (not shown) could be provided between the rotor shaft and fan). It is also possible for certain inventive aspects for the radial fan to be mounted to a motor shaft that is not directly connected to the mechanism powered by the motor.

Preferably, the shaft 70 of the rotor 62 defines the output shaft of the motor 52, which is drivingly connected to the pump. It will be appreciated, however, that certain aspects of the present invention contemplate the motor output shaft not being the rotor shaft. For example, the motor may alternatively be provided with a transmission (e.g., a gear drive) between the rotor shaft and output shaft, with the shafts being drivingly connected but otherwise discrete and spaced apart.

The motor housing 60 preferably includes a shell 78, endshields 80,82, and fasteners 84 (see FIGS. 1-3, 32, and 35). The housing 60 also presents an exterior motor surface 86 (see FIGS. 32-35). The shell 78 and the endshields 80 and 82 preferably present an internal motor chamber 88 that at least substantially receives the stator 64 and the rotor 62 (see FIG. 2).

In a preferred embodiment, the shell 78 extends generally circumferentially about the stator 64. It is permissible according to some aspects of the present invention, however, for the shell to extend in such a manner as to provide one or more flat sides, in contrast to the preferred generally cylindrical form, or to be otherwise alternatively shaped.

The endshields 80,82 preferably support respective bearings 72. The depicted endshields 80 and 82 are preferably secured to the shell 78 by means of the fasteners 84. However, it is within the ambit of certain aspects of the present invention for the housing to have an alternative shell and/or alternative endshields. Furthermore, the shell and endshields could be alternatively secured to one another.

In the illustrated embodiment, the endshields 80 and 82 each include a bearing housing 90 that presents a bearing pocket 92 receiving the respective bearing 72 (see FIG. 2). The endshields 80 and 82 also present relief openings 94 (see FIG. 2). The bearing pocket 92 and the respective relief opening 94 cooperatively provide a shaft opening 96 that permits the shaft 70 to extend therethrough from the motor chamber 88 to outside the housing 60 (see FIG. 2).

Again, the bearings 72 preferably cooperatively rotatably support the shaft 70. However, alternative or additional bearings, supports, or shaft supports may be provided without departing from the scope of the present invention.

As will be explained further below, the motor fan assembly 54 is operable to advance airflow along the exterior motor surface 86 of the motor housing 60 to cool the motor control assembly 56. The motor fan assembly 54 is mounted externally to the motor housing 60 and includes a radial fan 98 and a fan guard 100 (see FIGS. 32-35).

Although the illustrated radial fan 98 is preferably used with the depicted motor 52, the radial fan could be used in connection with a wide range of motor configurations. For example, the shaft 70 of the rotor 62 preferably extends into and out of the housing 60 so that the radial fan 98 is mounted directly on the shaft 70 and is thereby driven directly by the rotor 62. However, in alternative embodiments, the radial fan could be powered by the rotor without being mounted on the rotor shaft (as noted above). Further, as mentioned previously, according to certain aspects of the present invention, the radial fan and rotor shaft could be interconnected by a transmission (not shown). In such alternative embodiments, the transmission could provide a transmission output shaft separate from the rotor shaft, where the radial fan is mounted on the transmission output shaft.

Motor Control Assembly

Turning to FIGS. 3-14, the motor control assembly 56 is configured to provide adjustable operation of the electric motor 52. The illustrated electric motor 52 is operable to drive a water pump (not shown), although the electric motor 52 could be configured to power a variety of alternative devices without departing from the scope of certain aspects of the present invention. The motor control assembly 56 includes a control housing 102, a motor controller 104, and a clamp assembly 106.

Control Housing

The control housing 102 preferably provides enclosed controller chambers 108a,b,c that are water-tight and sealed from the exterior of the control housing 102 (see FIGS. 4 and 7). The controller chambers 108a,b,c are preferably sealed from the exterior to prevent water, other fluids, or other contaminants from reaching high-voltage and low-voltage components in the control housing 102. The depicted control housing 102 includes a heat sink 110, a lower housing section 112, middle housing section 114, upper housing section 116, and a user interface housing 118 (see FIG. 4).

Turning to FIGS. 11-14, the lower housing section 112 includes a continuous side wall 120a, a bottom wall 120b, and an upstanding housing wall 120c. The side wall 120a extends about the bottom wall 120b to form a continuous perimeter margin 122 of the lower housing section 112. The bottom wall 120b includes a raised section 124 that presents a central opening 126 to receive the heat sink 110. The side wall 120a and bottom wall 120b cooperatively define channels 128 located on opposite sides of the raised section 124.

Turning to FIGS. 4-8, the middle housing section 114 includes a continuous side wall 130a, a lateral wall 130b, and an intermediate dividing wall 130c. The side wall 130a extends about the lateral wall 130b and the dividing wall 130c to form upper and lower perimeter margins 132a,b of the middle housing section 114.

The housing sections 112,114 and the heat sink 110 cooperatively form an enclosed PFC controller chamber 108a (see FIGS. 4 and 7). As will be explained, the PFC controller chamber 108a is configured to receive a power factor correction (PFC) circuit. The lower housing section 112 and middle housing section 114 are complementally shaped and removably engaged with one another along margins 122,132b that cooperatively form a continuous tongue-and-groove sealing joint 134. The sealing joint 134 preferably forms a continuous, hermetic seal between the sections 112,114 to restrict fluid ingress relative to the lower controller chamber 108a.

Turning again to FIGS. 11-14, the inductor wall 120c is integrally formed with the side wall 120a and projects inboard from the side wall 120a. The inductor wall 120c and side wall 120a extend transversely to the control board of the motor controller 104. The side wall 120a extends around the control board and partly defines the PFC controller chamber 108a.

As will be explained, the motor controller 104 preferably has an inductor mounted to the inductor wall 120c. The depicted inductor wall 120c presents an inboard wall surface 136 and an outboard wall surface 138. The inboard wall surface 136 faces the inductor, and the inductor is secured against the inboard wall surface 136 within the PFC controller chamber 108a.

The outboard wall surface 138 is located opposite the inboard wall surface 136. The outboard wall surface 138 defines a plurality of spaced-apart fins 140. The fins 140 preferably extend transversely to a board plane of the control board. The inductor wall 120c, including the fins 140, is configured to dissipate heat from the inductor via the outboard wall surface 138.

Turning to FIGS. 17 and 32-34, the heat sink 110 is operable to remove heat generated within the control housing 102 and includes a base 142 and a plurality of fins 144. Adjacent pairs of fins 144 define corresponding fin channels 146 that extend between opposite ends 148 of the heat sink 110 (see FIG. 17). The fins 144 extend axially along the exterior motor surface 86. The heat sink 110 is preferably formed of an aluminum alloy, but could include other materials (e.g., another metallic material such as carbon steel or stainless steel) within the scope of the present invention. As will be explained below, the motor fan assembly 54 is configured to direct axial air flow through the fan channels 146 to facilitate heat transfer from the heat sink 110.

The lower housing section 112 and the heat sink 110 are removably engaged with one another along a continuous sealing joint 150 (see FIG. 34). The sealing joint 150 preferably extends along and surrounds the central opening 126. The sealing joint 150 also preferably forms a continuous, hermetic seal between the lower housing section 112 and the heat sink 110 to restrict fluid or contaminant ingress relative to the PFC controller chamber 108a.

Turning to FIGS. 3, 4, 7, and 15, the upper housing section 116 includes a continuous side wall 152a and an upper wall 152b. The side wall 152a extends about the upper wall 152b to form a continuous perimeter margin 154 of the upper housing section. The upper housing section 116 also includes a series of gussets 156 to reinforce the upper wall 152b (see FIG. 4). The upper wall 152b defines an upper pocket 158 to receive the user interface (see FIG. 3).

The middle housing section 114 and the upper housing section 116 cooperatively form a low-voltage controller chamber 108b and a high-voltage controller chamber 108c (see FIG. 4). The middle housing section 114 and upper housing section are complementally shaped and are removably engaged with one another along a continuous sealing joint 160. The sealing joint 160 preferably forms a continuous, hermetic seal between the sections 114,116 to restrict fluid ingress relative to the controller chambers 108b and 108c.

The dividing wall 130c of the middle housing section 114 and one of the gussets 156 are removably engaged with one another along a joint 162 to separate the low-voltage controller chamber 108b and the high-voltage controller chamber 108c from one another (see FIG. 4). The joint 162 preferably restricts fluid communication between the low-voltage controller chamber 108b and the high-voltage controller chamber 108c.

The dividing wall 130c preferably receives an elastomeric grommet 164 that provides a sealed feedthrough location along the dividing wall 130c (see FIGS. 5 and 6). The grommet 164 is operable to receive a wiring harness 165 and allow the wiring harness 165 to extend between the controller chambers 108b and 108c (see FIGS. 5 and 6). The grommet 164 cooperates with the dividing wall 130*c* and the respective gusset 156 to provide the sealing joint 162 between the controller chambers 108*b* and 108*c*.

The user interface housing 118 includes a frame 166 and a user interface cover 168 rotatably connected to one another by a hinge 170 (see FIGS. 1 and 4). The frame 166 presents a frame opening 172 to operably receive the user interface of the motor controller 104 (see FIG. 4).

The lower housing section 112, middle housing section 114, upper housing section 116, and user interface housing 118 are all preferably formed of a synthetic resin material, although one or more of these components could include an alternative material without departing from the ambit of certain aspects of the present invention.

The depicted control housing 102 is preferably configured to provide sealed controller chambers 108*a,b,c* and operably enclose components of the motor controller 104. The principles of the present invention are equally applicable where the control housing is alternatively configured to suitably house elements of the controller. For some aspects of the present invention, it will be understood that at least some components of the control housing and/or the controller could be integrally provided as part of the electric motor. It will also be appreciated that the shape of the control housing may vary without departing from the scope of the present invention. Furthermore, certain aspects of the present invention contemplate different housing sectional arrangements or no sectioning at all.

Motor Controller and Inductor

Referring again to FIGS. 3-14, the motor controller 104 preferably includes a power factor correction (PFC) circuit board 174, a low-voltage drive interface board 176, a high-voltage interface 178, a relay board 180, and a user interface 182 (see FIGS. 4-6).

In the customary manner, the user interface 182 enables the operator to change one or more motor settings associated with motor (and preferably pump) operation. The user interface 182 includes an interface circuit board 184, a user interface display 186, and user interface controls 188 (see FIG. 4).

The PFC circuit board 174 is configured to facilitate adjustment of motor settings and provide corresponding control of motor operation. The PFC circuit board 174 includes, among other things, a control board 190, heat-generating electrical components 192, and an inductor 194 (see FIGS. 10 and 17).

The control board 190 is configured to support various electrical components and is mounted within the PFC controller chamber 108*a*. The control board 190 defines a board plane 196 and presents a perimeter margin 198 (see FIGS. 8 and 9). The perimeter margin 198 forms a notched opening that partly defines an open space 200 to receive the inductor 194 (see FIGS. 11 and 12).

In alternative embodiments, one or more elements of the control board 190 could be alternatively configured and/or positioned within the control housing (e.g., to provide suitable motor operation) without departing from the scope of the present invention.

Turning to FIGS. 8-12, the inductor 194 is operable for use as part of the PFC circuit board 174 to adjust the power factor associated with electrical power supplied to the electric motor 52. Preferably, the PFC circuit, including the inductor 194, is configured to increase the power factor, although other adjustments to the power factor are within the ambit of the present invention. The depicted inductor 194 includes a metal inductor core 202 and inductor windings 204 wrapped around the core 202 (see FIG. 8).

The illustrated inductor core 202 preferably has a toroidal core body with a generally circular core axis A2 (see FIG. 12). The windings 204 are preferably wrapped about the core axis A2 to form a series of loops 204*a* (see FIG. 12).

Preferably, the inductor core 202 and inductor windings 204 cooperatively present an inner margin 206 that defines an inductor opening 208 (see FIG. 12). The inductor opening 208 extends through the inductor core 202 along an inductor axis A3 (see FIG. 10).

The inductor 194 is operably coupled to the control board 190 by leads 204*b* of the windings 204 (see FIGS. 8 and 9). The leads 204*b* are coupled to contacts 210 associated with the control board 190 (see FIGS. 8 and 9).

The toroidal shape of the depicted inductor 194 is preferable. However, in alternative embodiments, the inductor could have an alternative inductor shape (e.g., cylindrical, rod-shaped, etc.) within the scope of the present invention.

The inductor 194 and the rest of the PFC circuit board 174 are preferably located within the control housing 102 to optimize the use of space within the control housing 102 and enable the design of the control housing 102 to have a small form factor.

The motor controller 104 includes an inductor fastener assembly 212 that extends through the inductor opening 208 to secure the inductor 194 to the control housing 102. The inductor fastener assembly 212 includes an insulation pad 212*a*, a silicone washer 212*b*, a spacer 212*c*, and a threaded fastener 212*d* (see FIGS. 10 and 12).

The insulation pad 212*a* and the silicone washer 212*b* are received between the spacer 212*c* and the inductor 194. The spacer 212*c* extends through the inductor opening 208 and is secured to the inductor wall 120*c* by the threaded fastener 212*d*. A thermal pad 214 is positioned between the inductor 194 and the inductor wall 120*c* and is operable to conduct heat from the inductor 194 to the inductor wall 120*c* to facilitate dissipation of heat from the inductor 194 (see FIGS. 10 and 12). Although the inductor fastener assembly 212 and the thermal pad 214 are preferred for mounting the inductor 194, one or more of these components could be alternatively configured to suitably mount the inductor.

The inductor 194 is attached to the control housing 102 and positioned within the PFC controller chamber 108*a* adjacent the control board 190. When secured to the inductor wall 120*c*, the inductor 194 is located at least partly within the open space 200 and extends into and out of the corresponding channel 128. The inner margin 206 of the inductor 194 circumscribes the spacer 212*c*. The inductor 194 is also positioned to extend radially relative to the inductor axis A3 beyond opposite sides of the control board 190. The inductor 194 is preferably arranged within the PFC controller chamber 108*a* so that the inductor axis A3 extends substantially parallel to the board plane 196.

When mounted in the PFC controller chamber 108*a*, the inductor 194 defines maximum first and second inductor dimensions D1,D2 measured along corresponding first and second directions (see FIG. 11). The first and second directions are generally parallel to the board plane 196 and orthogonal to one another. As used herein, when referring to a feature (e.g., a dimension) as being parallel to the board plane, it is within the scope of the present invention for such feature, if the feature includes or is part of a planar component, to be coplanar with the board plane.

The inductor 194 further defines a maximum third inductor dimension D3 measured along a third direction transverse to the board plane 196 (see FIG. 12). In the depicted embodiment, the second and third inductor dimensions D2 and D3 are diametrical dimensions of the inductor 194.

Preferably, at least one of the first and second inductor dimensions D1,D2 is less than the maximum third inductor dimension D3. Again, because the illustrated inductor 194 is toroidal in shape, the second and third inductor dimensions D2 and D3 are substantially identical, with the first inductor dimension D1 being less than both. When referring to a "maximum" dimension of the inductor, the maximum dimension refers to the maximum size of the inductor as measured in the corresponding direction. That is to say, the maximum dimension constitutes the greatest length of the inductor in the corresponding direction, regardless of where that maximum dimension might fall along the body.

In the depicted embodiment, the control board 190 and the board plane 196 extend laterally. As a result, the inductor 194 is arranged in a generally upright orientation. The inductor 194 is preferably oriented relative to the control board 190 to optimize the use of space within the control housing 102. The illustrated inductor orientation also preferably enables the control housing 102 to have a small form factor.

Still referring to FIGS. 8-12, the inboard wall surface 136 of the inductor wall 120*c* faces the inductor 194 and restricts movement of the inductor 194 within the PFC controller chamber 108*a*. In the illustrated embodiment, the inboard wall surface 136 spans the inductor 194 and is at least coextensive with the inductor 194. In particular, the inboard wall surface 136 is at least coextensive with the length of the first inductor dimension and the length of the third inductor dimension.

In alternative embodiments, the inductor wall 120*c* could be alternatively configured to extend along and support the inductor (e.g., where the inductor wall is not coextensive with the inductor).

Clamp Assembly

Turning to FIGS. 15-23, the clamp assembly 106 is configured to engage heat-generating electrical components 192 to facilitate transfer of heat from the components 192 to the heat sink 110. In the depicted embodiment, the clamp assembly 106 is operable to engage at least three heat-generating electrical components 192 (which are preferably arranged side-by-side) and clamp the electrical components 192 relative to the heat sink 110. The clamp assembly 106 preferably includes a clamp bar 216 and threaded fasteners 218 to secure the clamp bar 216 to the heat sink 110.

The electrical components 192 clamped in place by the clamp assembly 106 are preferably MOSFETs, but other heat-generating electrical components could be engaged by the clamp assembly 106. As will be discussed, the electrical components 192 each present a thickness dimension.

The disclosed motor controller 104 preferably has three (3) electrical components 192 arranged along and operably coupled to the control board 190 (see FIG. 15). However, the principles of the present invention are applicable where an alternative number of electrical components 192 (whether the components 192 include MOSFETs and/or other heat-generating electrical components) are positioned along the control board 190.

The electrical components 192 are preferably arranged in series along the length of the clamp bar 216. Furthermore, the electrical components 192 are generally axially aligned with one another along a longitudinal clamp axis A4 (see FIG. 23). However, the electrical components 192 could be alternatively positioned consistent with the scope of the present invention. In alternative embodiments, the electrical components could be arranged in series along the clamp bar length, but with one or more components being laterally offset from the longitudinal clamp axis.

The clamp bar 216 preferably includes a clamp margin 220 and a backing flange 222. The backing flange 222 essentially serves as a support for the clamp margin 220 (see FIGS. 22 and 23). The depicted clamp margin 220 extends continuously along the length of the clamp bar 216. The clamp margin 220 preferably defines three (3) spaced apart projections 224 and presents a clamping surface 226 (see FIGS. 22 and 23). The backing flange 222 presents a flange surface 228 opposite the clamping surface 226 (see FIGS. 19 and 22). The clamping surface 226 and flange surface 228 cooperatively define a maximum clamp height dimension H1 (see FIG. 19). The clamp bar 216 also presents a slot 230 and a pair of fastener openings 232 (see FIGS. 22 and 23).

Preferably, the slot 230 extends transversely to the clamp axis A4 and is positioned between two of the projections 224. The depicted slot 230 also defines respective clamp bar sections 216*a* on opposite sides of the slot 230. In particular, the slot 230 intersects the flange surface 228 and extends transversely from the flange surface 228 toward the clamping surface 226. Preferably, the slot 230 extends through the backing flange 222 to present flange sections 222*a* separated by the slot 230. In the depicted embodiment, the flange sections 222*a* are associated with respective clamp bar sections 216*a*.

The depicted slot 230 is described as extending transversely to the clamp axis A4. While the illustrated slot 230 and clamp axis A4 are generally perpendicular to one another, it will be understood that the slot and clamp axis could extend transversely to one another without being perpendicular. That is, the slot could simply extend across the clamp axis, and it will be appreciated that the angle formed therebetween could vary within the ambit of the present invention.

Although the slot 230 extends through the backing flange 222, in alternative embodiments, the slot 230 could extend through at least one of the clamp margin 220 and the flange 222 to provide desirable clamp functionality. For instance, the slot 230 could be variously configured so that the clamp bar 216 is flexible along its length and allows the clamp bar sections 216*a* to shift relative to one another.

The configuration of slot 230 and the clamp margin 220 permits the clamp bar sections 216*a* to shift relative to one another about a transverse axis to facilitate clamping engagement of the projections 224 with the electrical components 192. In particular, the reduced cross-sectional dimension of the clamp bar 216 at the location of the slot 230 facilitates flexing. More particularly, the clamp margin 220 is flexible, thereby facilitating shifting of the clamp bar sections 216*a* generally about the portion of the clamp margin 220 interconnecting the clamp bar sections (i.e., the portion of the clamp margin 220 underlying the slot 230). Yet further, the slot 230 serves to space the flange sections 222 apart to allow shifting of the clamp bar sections 216*a*. Therefore, the slot 230 and clamp margin 220 cooperatively permit shifting of the clamp bar sections 216*a* toward one another (see FIG. 20) or away from one another (see FIG. 21). As will be discussed, the clamp bar sections 216*a* are preferably relatively shiftable so that the clamp bar 216 engages each of the electrical components 192.

The clamp bar 216 is preferably formed of a synthetic resin material. By including a synthetic resin material, the clamp bar 216 preferably serves as an insulator. The synthetic resin material also preferably permits flexing of the clamp bar, as discussed above. For certain aspects of the present invention, the clamp bar could include, alternatively or additionally, a metallic material (such as carbon steel or aluminum). It will be appreciated that metallic features of the clamp bar could be cast, machined, and/or formed by other manufacturing methods.

In alternative embodiments where the clamp bar includes a metallic material, the alternative clamp bar also preferably includes at least some insulation material (e.g., a synthetic resin) used in combination with a metallic portion of the clamp bar. The insulation material can be variously provided with the metallic portion within the scope of the present invention. For instance, an insulation portion comprised of synthetic resin could be molded onto the metallic portion. Similarly, one or more insulation layers could be attached (e.g., adhered) relative to the metallic portion.

The projections 224 are configured to be located in engagement with the respective electrical components 192. The projections 224 are depicted as being in direct contact with the electrical components 192. However, when referring to the projections as being in engagement with the electrical components, it will be understood that one or more material layers may be interposed between the projections and electrical components. For instance, such interposed layers may include a film (e.g., a film including a synthetic resin material, such as Mylar®), fabric, paste, grease, liquid, and/or other material. One or more interposed layers may be considered as integrally part of the electrical components. In any event, any interposed layers are preferably configured to permit the clamp bar to apply a clamping force to the electrical components.

In the depicted embodiment, the projections 224 are spaced in series along the length of the clamp bar 216 to provide opposite endmost projections 224 and an intermediate projection 224. The depicted projections 224 are spaced along and define the clamp axis A4. The clamp margin 220 extends continuously between the endmost projections to join the clamp bar sections 216a. In the depicted embodiment, the slot 230 is longitudinally aligned with the intermediate projection 224.

The fastener openings 232 each extend transversely through the clamp margin 220 and the backing flange 222. Each fastener opening 232 is preferably positioned between a respective pair of adjacent projections 224. In this manner, the clamp assembly 106 is preferably configured so that each fastener 218 is located between the respective pair of adjacent projections 224 (and also between corresponding electrical components 192). The fastener openings 232 are preferably arranged in series along the length of the clamp bar 216 and generally axially aligned with one another along the longitudinal clamp axis A4.

Although the clamp bar 216 includes a pair of fastener openings 232, alternative embodiments of the clamp bar could have more than two fastener openings or a single fastener opening. For instance, the clamp bar could have four projections and three fastener openings, with each fastener opening located between a respective adjacent pair of projections. For certain aspects of the present invention, the clamp bar could also present a common opening to receive two or more fasteners. In such an alternative embodiment, the clamp bar could present an elongated slotted opening that extends transversely through the clamp margin 220 and the backing flange 222 while extending along the clamp axis.

It is also within the ambit of the present invention where the fastener openings are alternatively located along the clamp bar. For instance, the fastener openings could be arranged in series, but with one or more fastener openings being laterally offset from the longitudinal axis. For some aspects of the present invention, the clamp bar could be devoid of fastener openings (e.g., where an alternative fastener is used to secure the clamp bar).

The fasteners 218 are configured to engage the flange sections 222a to hold the clamp bar 216 against the electrical components 192. The fasteners 218 comprise conventional machine screws that are removably received by the clamp bar 216, but could include other types of fastening devices or elements within the ambit of the present invention. For example, in alternative embodiments, a fastener could comprise one or more of a bolt, nut, washer, pin, rivet, adhesive, or weld. It is also within the scope of the present invention where at least part of the fastener is integrally formed with the clamp bar.

Although the clamp bar 216 includes a pair of fasteners 218, alternative embodiments of the clamp bar could have more than two fasteners or a single fastener. It is also within the ambit of the present invention where the fasteners are alternatively located along the clamp bar. For instance, the fasteners could be arranged in series, but with one or more fasteners being laterally offset from the longitudinal axis. For some aspects of the present invention, the clamp bar assembly could be devoid of fasteners.

In use, the clamp bar 216 is configured to engage heat-generating electrical components 192 and urge the electrical components against the heat sink 110. The electrical components are depicted as being in direct contact with the heat sink 110. However, when referring to the electrical components as being in engagement with the heat sink, it will be understood that one or more material layers may be interposed between the electrical components and the heat sink. For instance, such interposed layers may include a film (e.g., a film including a synthetic resin material, such as Mylar®), fabric, paste, grease, liquid, and/or other material. Again, one or more interposed layers may be considered as integrally part of the electrical components. An interposed layer between the electrical components and the heat sink is preferably to facilitate heat conduction from the electrical components to the heat sink. Any interposed layers are preferably configured to permit the electrical components to be clamped against the heat sink.

The clamp assembly 106 is preferably configured to engage various arrangements of electrical components. In one embodiment, the clamp bar 216 is illustrated as engaging electrical components 192 that each have substantially the same thickness dimension T1 (see FIG. 19). However, the clamp bar 216 is preferably operable to engage electrical components 192 with different thickness dimensions T1,T2, T3 (see FIGS. 20 and 21).

Again, the clamp bar sections 216a are preferably relatively shiftable so that the clamp bar 216 can engage each electrical component 192. More specifically, the clamp bar 216 is configured to flex to facilitate clamping engagement of the projections 224 with the electrical components 192. This configuration enables the clamp bar 216 to engage electrical components having different thickness dimensions T1,T2,T3.

In one such example, the clamp bar sections 216a can flex away from the heat sink 110 to engage an intermediate electrical component 192 with a thickness dimension T1 shorter than a thickness dimension T2 of adjacent electrical components 192 (see FIG. 20).

In another example, the clamp bar sections 216a can flex toward the heat sink 110 to engage endmost electrical components 192 with a thickness dimension T3 shorter than a thickness dimension T1 of an intermediate electrical component 192 (see FIG. 21). For certain aspects of the present invention, the clamp bar could be secured so that one clamp bar section flexes toward the heat sink and another clamp bar section flexes away from the heat sink.

Again, in the depicted embodiment, the projections 224 are arranged in series along the length of the clamp bar 216. Furthermore, the projections 224 are generally axially aligned with one another along the longitudinal clamp axis A4 of the clamp bar 216.

However, the projections 224 could be alternatively positioned according to certain aspects of the present invention. In alternative embodiments, the projections could be arranged in series along the clamp bar length, but with one or more projections being laterally offset from the longitudinal axis. In one alternative example, the clamp bar could have three (3) projections arranged in a triangular configuration such that each projection is located at a respective point of the triangle. In such an alternative embodiment, it will be understood that any pair of projections would cooperatively define a respective clamp axis.

Turning to FIGS. 24-27, an alternative clamp assembly 234 is depicted as part of the motor controller. The alternative clamp assembly 234 includes an alternative clamp bar 236 and fasteners 218.

The clamp bar 236 preferably includes an alternative clamp margin 238, a backing flange 240, and spacers 242 projecting from the clamp margin 238. The clamp margin 238 defines three spaced apart projections 244.

The depicted spacers 242 each preferably include a sleeve having a generally tubular shape. The spacers 242 are located between respective adjacent pairs of projections 244. However, one or more spacers could be alternatively configured and/or positioned without departing from the scope of the present invention.

The flange 240 includes flange sections 240a defined on opposite sides of a slot 245. The clamp bar 236 also presents fastener openings 246 extending transversely through the flange sections 240a, the clamp margin 238, and through respective spacers 242.

The inside diameter of the fastener openings 246, particularly along the spacers 242, is preferably oversized relative to the outside diameter of the threaded body of the fasteners 218. The oversized fastener openings 246 preferably accommodates a slight angular cant of the spacers 242 (and, generally, the clamp bar sections) associated with flexing of the clamp bar.

The spacers 242 serve a number of purposes. For example, in certain arrangements, the spacers 242 may restrict the clamp bar 236 from applying too much clamping force to the electrical components 192 (i.e., by overly tightening the fasteners 218). When in clamping engagement with the electrical components 192, the spacers 242 and the heat sink 110 preferably define a slight gap G therebetween (see FIG. 25), although contact between the bottom of the spacer 242 and the heat sink 110 will restrict or limit the clamping force. Furthermore, the spacers generally encapsulate the fasteners 218 (which are preferably metal and possibly electrically conductive) and thereby reduce the risk of arcing to the fasteners.

In FIGS. 28-31, another alternative clamp assembly 248 is depicted. The alternative clamp assembly 248 includes an alternative clamp bar 250 and fasteners 218.

The clamp bar 250 preferably includes a clamp margin 252 and a backing flange 254 to support the clamp margin 252. The clamp margin 252 defines three (3) spaced apart projections 256.

The backing flange 254 includes flange sections 254a defined on opposite sides of a slot 257. The backing flange 254 presents a flange surface 258 opposite a clamping surface 260. The clamping surface 260 and flange surface 258 cooperatively define a maximum clamp height dimension H2. The clamp bar 250 is similar to clamp bar 216, but the clamp bar 250 preferably has a maximum clamp height dimension H2 greater than the height dimension H1 of clamp bar 216. More preferably, the ratio of the maximum clamp height dimension H2 of clamp bar 250 to the height dimension H1 of clamp bar 216 is about 2/1, although this ratio could also range from about 1.5/1 to about 3/1 within the scope of the present invention.

Motor Fan Assembly

Turning to FIGS. 2 and 32-42, the motor fan assembly 54 serves to direct airflow toward the heat sink 110, thereby facilitating heat dissipation from the heat sink 110. The motor fan assembly 54 broadly includes the radial fan 98 and the fan guard 100.

The radial fan 98 is configured to drive airflow to the heat sink 110. The radial fan 98 is preferably mounted on the rotatable shaft 70 exteriorly of the motor housing 60 and is rotatable with the shaft 70 in a rotation direction R (see FIGS. 32 and 40) to direct airflow radially outwardly.

In the illustrated embodiment, the radial fan 98 is unitary and includes a hub 266 and a wheel 268. The radial fan 98 presents a rotational axis A5 about which the radial fan 98 rotates (see FIGS. 40 and 42). It will be appreciated that the rotational axis A5 and the shaft axis A1 are substantially coaxial in the illustrated embodiment. In the usual manner, the hub 266 presents a shaft hole 270 receiving the exposed portion 74b of the shaft 70 when the radial fan 98 is mounted on the shaft 70.

The radial fan 98 is fixed relative to the shaft 70 outside the housing 60 and is rotatable with the shaft 70 to direct air flow radially outwardly. Most preferably, the radial fan 98 is fixedly attached directly to the shaft 70. Again, it is within the scope of the present invention where the radial fan 98 is mounted on an output shaft other than the shaft 70 (e.g., a transmission output shaft). In such an alternative embodiment, it will be understood that the rotational axis and the rotor shaft axis could be coaxial or axially offset from one another (e.g., depending on the configuration of the transmission).

In the preferred embodiment, the shaft hole 270 is complementally sized and shaped so that the shaft 70 is snugly received in the shaft hole 270. In the depicted embodiment, the radial fan 98 is preferably frictionally engaged with the shaft 70 so as to be fixedly attached thereto (see FIG. 7).

However, it is within the scope of certain aspects of the present invention for the hub to be alternatively configured for driving attachment to the output shaft. For instance, although the illustrated hub provides a non-circular bore, the hub could have a profile shape that is splined or has a circular shape for mating with a corresponding shape of the output shaft.

In various alternative embodiments, the hub could be alternatively fixed to the output shaft, whether or not the output shaft extends entirely through the hub. For instance, the hub could be secured to the output shaft with one or more fasteners (e.g., a set screw, cotter pin, etc.). In addition, the hub may be press fit to the shaft. Also in alternative embodiments, the hub could be configured so that the output shaft extends only partly through the hub or does not project from both ends of the hub.

The illustrated wheel 268 drives airflow radially outwardly. Preferably, the wheel 268 includes a wheel plate 272 and a plurality of radially extending fan blades 274. Preferably, the wheel plate 272 and fan blades 274 cooperatively form a series of passages 276 (see FIG. 40) extending radially outward relative to the hub 266.

The wheel plate 272 is supported by the hub 266 and located axially outboard of the housing 60 when the motor 52 is secured for operation. The wheel plate 272 of the illustrated embodiment is preferably continuous and extends to an outer plate margin 278 (see FIG. 40). The outer plate margin 278 extends circumferentially so that the wheel plate 272 is generally circular in shape and presents opposed notches 280.

For some aspects of the present invention, the wheel plate 272 could be alternatively constructed (e.g., where the wheel plate 272 is not continuous). The depicted wheel plate 272 is fixed to the hub 266 and is preferably positioned so that the center of the outer plate margin 278 corresponds to the rotational axis A5. Those of skill in the art will also appreciate that the wheel plate could be alternatively shaped without departing from the principles of the present invention.

The fan blades 274 partly define the passages 276 and facilitate airflow in a radially outward direction within the passages 276. Each adjacent pair of fan blades 274 presents a fan discharge opening 282 through which airflow is discharged from the corresponding passage 276 (see FIG. 40).

Each fan blade 274 presents an exterior blade surface 284 having a curvilinear airfoil profile (see FIG. 38). The airfoil profile defines a leading edge 286, a trailing edge 288, and a longitudinal edge 290 (see FIG. 38). The leading edge 286 is spaced radially inside the trailing edge 288. The airfoil profile also defines a curved camber line 292 extending between the leading edge 286 and the trailing edge 288 (see FIG. 40).

The exterior blade surface 284 of each fan blade 274 includes pressure and suction surfaces 284a,b on opposite sides of the camber line 292 and extending radially between the leading edge 286 and the trailing edge 288 (see FIG. 40). Preferably, the pressure surface 284a faces into the rotational direction R, and a portion of the pressure surface 284a is concave. The suction surface 284b preferably faces oppositely from the rotational direction R, and at least part of the suction surface 284b is convex.

However, the pressure surface and/or suction surface of the fan blade could be alternatively configured without departing from the scope of certain aspects of the present invention. For instance, although a majority of the pressure surface 284a is concave, the pressure surface could have one or more alternative portions that include convex, flat, and/or concave features. Similarly, although the suction surface 284b is generally convex, the suction surface could have one or more alternative portions that include convex, flat, and/or concave features.

The airfoil profile of each fan blade 274 also preferably has a chord line 294 comprising a straight line that extends through the leading edge 286 and the trailing edge 288 (see FIG. 40). Each fan blade 274 is associated with a radial line extending through the rotational axis A5 and the leading edge 286. The chord line 294 and the radial line of the depicted fan blades 274 are off-axis to define an angle of attack θ therebetween (see FIG. 40). Preferably, the chord line 294 extends from the radial line along a direction opposite the rotational direction R.

Again, in accordance with certain aspects of the present invention, the fan blades could also have an alternative blade shape. For instance, the fan blades could have an alternative curved airfoil shape (e.g., to induce a greater airflow). For some aspects of the present invention, one or more fan blades could include flat blade sections.

The radial fan 98 preferably comprises a synthetic resin material, such as an elastomeric material. It is equally within the ambit of the present invention where the radial fan includes, alternatively or additionally, one or more other materials. For instance, the radial fan could include one or more metallic materials (e.g., carbon steel, stainless steel, and/or aluminum).

In the illustrated embodiment, the radial fan 98 preferably comprises a one-piece construction. However, for some aspects of the present invention, the radial fan could include multiple components that are attached to one another (e.g., where the components are welded, adhered, fastened, and/or otherwise secured to one another).

Turning to FIGS. 34-37, the illustrated fan guard 100 preferably protects the radial fan 98, particularly during fan operation. The fan guard 100 is also preferably operable to direct airflow from the radial fan 98 toward the heat sink 110. The fan guard 100 preferably includes a fan cover 296 and an air scoop 298 that are integrally formed with one another.

The fan guard 100 is mounted relative to the motor housing 60 and extends over the radial fan 98. The fan guard 100 cooperates with the motor housing 60 to define a fan chamber 300 and a fan outlet opening 302 (see FIG. 34). The fan chamber 300 extends between a fan inlet opening 304 and the fan outlet opening 302.

The fan cover 296 includes a central grate 306 and a peripheral skirt 308 that extends axially from the central grate 306. The skirt 308 extends circumferentially about the central grate 306 and presents multiple fastener openings 310.

In the depicted embodiment, the central grate 306 presents the fan inlet opening 304. The radial fan 98 is operable to draw air axially into fan chamber 300 via the fan inlet opening 304.

The skirt 308 is preferably sized to be received on one end of the motor housing 60. Radially-extending threaded fasteners 312 are inserted in the openings 310 and threaded into bosses 314 associated with the endshield 82 (see FIG. 35). The fan guard 100 is arranged so that the radial fan 98 is axially outboard of the fasteners 312.

Although the fan guard 100 preferably includes the fan cover 296, the fan cover could be alternatively configured without departing from the scope of the present invention. For certain aspects of the invention, the motor fan assembly could be devoid of a fan cover. For instance, the motor fan assembly could use an air scoop without using a fan cover.

In the illustrated embodiment, the air scoop 298 is operable to receive radial airflow from the radial fan 98 and turn the airflow axially. The air scoop 298 preferably includes a scoop body 316 and spaced apart axially extending airflow vanes 318. The airflow vanes 318 at least partly define scoop channels 319 that extend axially along the airflow vanes 318 (see FIG. 37). The airflow vanes 318 guide the airflow as the air scoop 298 turns the airflow axially.

The air scoop 298 partly defines the fan outlet opening 302 of the fan chamber 300, with axial airflow being discharged by the fan outlet opening 302. The air scoop 298 presents an air scoop inlet 320 and an air scoop outlet 322 (see FIG. 34). The scoop body 316 preferably presents a curved inside face 324 located between the air scoop inlet 320 and the air scoop outlet 322. The curved inside face 324 generally defines the airflow turn provided by the air scoop 298. In the depicted embodiment, the airflow vanes 318 project from the inside face 324. For certain aspects of the present invention, the inside face of the air scoop (or other parts of the air scoop) could have an alternative shape and/or configuration for turning the airflow axially.

The airflow vanes 318 extend between the air scoop inlet 320 and the air scoop outlet 322. The fan blades 274 extend along an axial blade dimension D4 (see FIG. 34). The depicted air flow vanes 318 are aligned axially with at least part of the axial blade dimension D4. Within the ambit of the present invention, the air flow vanes could be configured to extend along only part of the axial extent of the fan blades. For certain aspects of the present invention, the air flow vanes could be entirely axially offset from the fan blades.

The air scoop outlet 322 is associated with the fan outlet opening 302 in the depicted embodiment. The air scoop 298 extends radially outwardly relative to the radial fan 98 and axially along the rotational axis A5 to receive radial airflow and turn the airflow axially to flow through the air scoop outlet 322 and along the exterior motor surface 86.

The fan guard 100 is installed so that the fan outlet opening 302 is generally aligned with and communicates with one end 148 of the heat sink 110. Preferably, at least some of the airflow vanes 318 are in general alignment with corresponding fins 144 of the heat sink 110. The scoop channels 319 are also preferably in at least partial alignment with respective fin channels 146 of the heat sink 110. Thus, as the radial fan 98 produces airflow, the airflow is turned axially by the air scoop 298 and discharged axially to flow through the fin channels 146 of the heat sink 110. In this manner, the motor fan assembly 54 facilitates heat transfer out of the heat sink 110 during motor operation.

Although the above description presents features of preferred embodiments of the present invention, other preferred embodiments may also be created in keeping with the principles of the invention. Such other preferred embodiments may, for instance, be provided with features drawn from one or more of the embodiments described above. Yet further, such other preferred embodiments may include features from multiple embodiments described above, particularly where such features are compatible for use together despite having been presented independently as part of separate embodiments in the above description.

The preferred forms of the invention described above are to be used as illustration only, and should not be utilized in a limiting sense in interpreting the scope of the present invention. Obvious modifications to the exemplary embodiments, as hereinabove set forth, could be readily made by those skilled in the art without departing from the spirit of the present invention.

The inventors hereby state their intent to rely on the Doctrine of Equivalents to determine and assess the reasonably fair scope of the present invention as pertains to any apparatus not materially departing from but outside the literal scope of the invention as set forth in the following claims.

The invention claimed is:

1. A clamp assembly operable to engage at least three heat-generating electrical components arranged side-by-side and clamp the electrical components relative to a heat sink, said clamp assembly comprising:
   a clamp bar and a fastener to secure the clamp bar to the heat sink,
   said clamp bar including at least three spaced apart projections configured to be located in engagement with the respective electrical components,
   said clamp bar including a clamp margin and a solid-bodied backing flange that supports the clamp margin, with the clamp margin defining the projections and presenting a clamping surface,
   said clamp bar presenting a slot positioned between a spaced apart pair of the projections and defining respective clamp bar sections on opposite sides thereof,
   said pair of the projections defining therebetween a clamp axis,
   said slot extending across and through the entirety of the solid-bodied flange in an extension direction transverse to the clamp axis, from a front face of the flange to a back face of the flange, to present solid-bodied flange sections separated in their entirety by the slot and associated with respective clamp bar sections,
   said slot being spaced from the clamping surface in a spacing direction transverse to the clamp axis and to the extension direction, with the slot permitting the clamp bar sections to shift relative to one another and thereby facilitate clamping engagement of the projections with the electrical components,
   said flange presenting a flange surface opposite the clamping surface,
   said slot extending downward through the flange in the spacing direction, from the flange surface toward the clamp margin,
   said slot terminating adjacent the clamp margin such that a portion of the clamp margin underlies the slot and the slot is offset in the spacing direction relative to the projections.

2. The clamp assembly as claimed in claim 1,
   said clamp margin being flexible to allow the clamp bar sections to shift relative to one another.

3. The clamp assembly as claimed in claim 2,
   said clamp margin extending between the pair of the projections to join the clamp bar sections.

4. The clamp assembly as claimed in claim 3,
   said flange being operable to be engaged by the fastener, when the clamp bar is secured to the heat sink.

5. The clamp assembly as claimed in claim 4,
   said flange surface operable to be engaged by the fastener.

6. The clamp assembly as claimed in claim 1, said slot extending perpendicularly to the clamp axis.

7. The clamp assembly as claimed in claim 2,
   said projections being spaced in series along the length of the clamp bar, with an intermediate one of the projections positioned between the pair of the projections,
   said slot being aligned with the intermediate projection.

8. The clamp assembly as claimed in claim 1, further comprising:
   a plurality of fasteners including the first-mentioned fastener,
   each of said clamp bar sections being engaged by one of the fasteners, when the clamp bar is secured to the heat sink,
   said clamp bar further including a plurality of spacers projecting relative to the clamp margin and configured to receive respective fasteners.

9. The clamp assembly as claimed in claim 1,
   said projections being spaced in series along the length of the clamp bar, with an intermediate one of the projections positioned between the pair of the projections,
   said slot being longitudinally aligned with the intermediate projection.

10. The clamp assembly as claimed in claim 9, further comprising:
    a plurality of fasteners including the first-mentioned fastener, each of said fasteners being located between adjacent ones of the projections.

11. An apparatus comprising:
a heat sink;
at least three heat-generating electrical components arranged side-by-side; and
a clamp assembly clamping the heat-generating electrical components relative to the heat sink,
said clamp assembly including a clamp bar and a fastener securing the clamp bar to the heat sink,
said clamp bar including at least three spaced apart projections engaging respective electrical components,
said clamp bar including a clamp margin and a solid-bodied backing flange that supports the clamp margin, with the clamp margin defining the projections and presenting a clamping surface,
said clamp bar presenting a slot positioned between a spaced apart pair of the projections and defining respective clamp bar sections on opposite sides thereof,
said pair of the projections defining therebetween a clamp axis,
said slot extending across and through the entirety of the solid-bodied flange in an extension direction transverse to the clamp axis, from a front face of the flange to a back face of the flange, to present solid-bodied flange sections separated in their entirety by the slot and associated with respective clamp bar sections,
said slot being spaced from the clamping surface in a spacing direction transverse to the clamp axis and to the extension direction, with the slot permitting the clamp bar sections to shift relative to one another and thereby facilitate clamping engagement of the projections with the electrical components,
said flange presenting a flange surface opposite the clamping surface,
said slot extending downward through the flange in the spacing direction, from the flange surface toward the clamp margin,
said slot terminating adjacent the clamp margin such that a portion of the clamp margin underlies the slot and the slot is offset in the spacing direction relative to the projections.

12. The apparatus as claimed in claim 11,
said clamp margin being flexible to allow the clamp bar sections to shift relative to one another.

13. The apparatus as claimed in claim 12,
said clamp margin extending between the pair of the projections to join the clamp bar sections.

14. The apparatus as claimed in claim 13,
said flange surface being engaged by the.

15. The apparatus as claimed in claim 14,
said slot extending perpendicularly to the clamp axis.

16. The apparatus as claimed in claim 12,
said projections being spaced in series along the length of the clamp bar, with an intermediate one of the projections positioned between the pair of the projections,
said slot being longitudinally aligned with the intermediate projection.

17. The apparatus as claimed in claim 11, further comprising:
a plurality of fasteners including the first-mentioned fastener,
each of said clamp bar sections being engaged by one of the fasteners,
said clamp bar further including a plurality of spacers projecting relative to the clamp margin and receiving respective fasteners.

18. The apparatus as claimed in claim 11,
said projections being spaced in series along the length of the clamp bar, with an intermediate one of the projections positioned between the pair of the projections,
said slot being longitudinally aligned with the intermediate projection.

19. The apparatus as claimed in claim 18, further comprising:
a plurality of fasteners including the first-mentioned fastener,
each of said fasteners being located between adjacent ones of the projections.

20. The apparatus as claimed in claim 11, further comprising:
a controller assembly including a control board arranged alongside the heat sink,
said controller assembly including the electrical components, with the electrical components being mounted relative to the control board.

* * * * *